US011551619B2

(12) United States Patent
Seo

(10) Patent No.: US 11,551,619 B2
(45) Date of Patent: Jan. 10, 2023

(54) GATE DRIVER CIRCUIT AND DISPLAY DEVICE INCLUDING THE SAME

(71) Applicant: LG Display Co., Ltd., Seoul (KR)

(72) Inventor: Jeongrim Seo, Cheonan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/553,368

(22) Filed: Dec. 16, 2021

(65) Prior Publication Data
US 2022/0208109 A1   Jun. 30, 2022

(30) Foreign Application Priority Data

Dec. 24, 2020   (KR) .................. 10-2020-0183754

(51) Int. Cl.
*G09G 3/3266*   (2016.01)
*G09G 3/3291*   (2016.01)

(52) U.S. Cl.
CPC ......... *G09G 3/3266* (2013.01); *G09G 3/3291* (2013.01); *G09G 2310/08* (2013.01); *G09G 2330/028* (2013.01)

(58) Field of Classification Search
CPC ............... G09G 3/3266; G09G 3/3291; G09G 2310/08; G09G 2330/028
See application file for complete search history.

(56) References Cited

U.S. PATENT DOCUMENTS

| 2017/0213499 | A1* | 7/2017 | Kong | G11C 19/28 |
| 2018/0337682 | A1* | 11/2018 | Takasugi | H03K 21/18 |
| 2019/0139508 | A1* | 5/2019 | Park | G09G 3/20 |
| 2021/0074215 | A1* | 3/2021 | Park | G09G 3/3225 |
| 2021/0201767 | A1* | 7/2021 | Park | G09G 3/3233 |
| 2021/0201814 | A1* | 7/2021 | Choi | G09G 3/3266 |
| 2021/0201816 | A1* | 7/2021 | Kim | G09G 3/3266 |

FOREIGN PATENT DOCUMENTS

KR   10-2156767 B1   9/2020

* cited by examiner

*Primary Examiner* — Kenneth B Lee, Jr.
(74) *Attorney, Agent, or Firm* — Birch, Stewart, Kolasch & Birch, LLP

(57) ABSTRACT

A gate driver circuit can include a plurality of stage circuits, in which each of the plurality of stage circuits supplies a gate signal to gate lines arranged in a display panel, and includes an M node, a Q node, a QH node, a QB node, a line selector, a Q node controller, a Q node and QH node stabilizer, an inverter, a QB node stabilizer, a carry signal output circuit portion, a gate signal output circuit portion, and a Q node bootstrapper, in which the Q node bootstrapper is connected between the carry signal output circuit portion and the gate signal output circuit portion, or the gate signal output circuit portion is connected between the carry signal output circuit portion and the Q node bootstrapper.

20 Claims, 15 Drawing Sheets

GATE DRIVER CIRCUIT AND DISPLAY DEVICE INCLUDING THE SAME

CROSS-REFERENCE TO RELATED APPLICATION

This application claims priority to Korean Patent Application No. 10-2020-0183754, filed in the Republic of Korea on Dec. 24, 2020, the entire contents of which are expressly incorporated herein by reference into the present application.

BACKGROUND

Field

The present disclosure relates to a gate driver circuit and a display device including the same, in which an output difference between gate signals is reduced.

Description of Related Art

Recently, a display device using a flat display panel, such as a liquid crystal display device, an organic light-emitting display device, a light-emissive diode display device, and an electrical electrophoretic display device, etc., has been widely used.

A display device may include a pixel having a light-emissive element and a pixel circuit for driving the light-emissive element. For example, the pixel circuit includes a driving transistor that controls a driving current flowing through the light-emissive element, and at least one switching transistor that controls (or programs) a gate-source voltage of the driving transistor according to a gate signal. The switching transistor of the pixel circuit may be switched based on the gate signal output from a gate driver circuit disposed on a substrate of a display panel.

When an image is displayed from the display device, the gate signal for turning on the switching transistor is sequentially applied to gate lines of the display panel. When the switching transistor of a sub-pixel included in each line is turned on based on the gate signal, a data voltage is supplied to each sub-pixel such that light emits to display the image. Also, in order to display a high quality image having uniform luminosity, pulses of the gate signals output to the different lines should be uniform and consistent.

SUMMARY OF THE DISCLOSURE

The display panel included in the display device includes a plurality of gate lines, a plurality of data lines, and sub-pixels arranged at intersection areas between the data lines and the gate lines. When an image is displayed through the display panel, a gate signal for turning on a switching transistor is sequentially supplied to each gate line. When the switching transistor of the sub-pixel included in each line is turned on based on the gate signal, a data voltage is supplied to each sub-pixel such that light emits to display the image.

In this connection, when an output difference between gate signals respectively supplied to the gate lines occurs, that is, when magnitudes and time durations of voltages of the gate signals respectively supplied to the gate lines are not uniform, magnitudes of data voltages supplied to the sub-pixels respectively based on different gate lines may be different from each other. Thus, when an image is displayed through the display device, an output difference between lines may occur or an image of a specific line may be significantly different from an image of another line. Thus, an image display quality of the display device is deteriorated (e.g., some portions of the screen may appear brighter or darker to a viewer than they should be, due to variations in the gate signal pulses on different lines).

Therefore, output differences between the gate signals output from the gate driver circuit should be reduced.

The present disclosure provides embodiments for achieve the above-described technical purpose.

A purpose of the present disclosure is to improve an image display quality of a display device by reducing an output difference between gate signals output from the gate driver circuit.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

A gate driver circuit according to one embodiment of the present disclosure may supply a gate signal to each gate line and may include a plurality of stage circuits, each including an M node, a Q node, a QH node, and a QB node.

In one embodiment of the present disclosure, each stage circuit includes a line selector, a Q node controller, a Q node and QH node stabilizer, an inverter, a QB node stabilizer, a carry signal output module, a gate signal output module, and a Q node bootstrapper.

In response to an input of a line sensing preparation signal, the line selector charges the M node based on a front carry signal. In response to an input of a reset signal, the line selector charges the Q node to a first high-potential voltage level. In response to an input of a panel on signal, the line selector discharges the Q node to a third low-potential voltage level.

In response to an input of the front carry signal, the Q node controller charges the Q node to the first high-potential voltage level. In response to an input of a rear carry signal, the Q node controller discharges the Q node to the third low-potential voltage level.

The Q node and QH node stabilizers discharge the Q node and the QH node to the third low-potential voltage level when the QB node has been charged to a second high-potential voltage level.

The inverter changes a voltage level of the QB node based on a voltage level of the Q node.

The QB node stabilizer discharges the QB node to the third low-potential voltage level in response to an input of the rear carry signal, to an input of the reset signal, and to a charged voltage of the M node.

The carry signal output module outputs a carry signal based on a carry clock signal or the third low-potential voltage, according to a voltage level of the Q node or a voltage level of the QB node.

The gate signal output module outputs first to j-th gate signals based on a scan clock signal or a first low-potential voltage, according to a voltage level of the Q node or a voltage level of the QB node.

The Q node bootstrapper may bootstrap a voltage of the Q node when the gate signal is output.

Further, a display device according to one embodiment of the present disclosure includes a display panel including sub-pixels respectively disposed at intersections between gate lines and data lines, a gate driver circuit for supplying a scan signal to each gate line, a data driver circuit for supplying a data voltage to each data line, and a timing controller that controls an operation timing of each of the gate driver circuit and the data driver circuit.

In one embodiment of the present disclosure, the gate driver circuit may supply a gate signal to each gate line and may include a plurality of stage circuits, each including an M node, a Q node, a QH node, and a QB node.

In one embodiment of the present disclosure, each stage circuit includes a line selector, a Q node controller, a Q node and QH node stabilizer, an inverter, a QB node stabilizer, a carry signal output module, a gate signal output module, and a Q node bootstrapper.

In response to an input of a line sensing preparation signal, the line selector charges the M node based on a front carry signal. In response to an input of a reset signal, the line selector charges the Q node to a first high-potential voltage level. In response to an input of a panel on signal, the line selector discharges the Q node to a third low-potential voltage level.

In response to an input of the front carry signal, the Q node controller charges the Q node to the first high-potential voltage level. In response to an input of a rear carry signal, the Q node controller discharges the Q node to the third low-potential voltage level.

The Q node and QH node stabilizers discharge the Q node and the QH node to the third low-potential voltage level when the QB node has been charged to a second high-potential voltage level.

The inverter changes a voltage level of the QB node based on a voltage level of the Q node.

The QB node stabilizer discharges the QB node to the third low-potential voltage level in response to an input of the rear carry signal, to an input of the reset signal, and to a charged voltage of the M node.

The carry signal output module outputs a carry signal based on a carry clock signal or the third low-potential voltage, according to a voltage level of the Q node or a voltage level of the QB node.

The gate signal output module outputs first to j-th gate signals based on a scan clock signal or a first low-potential voltage, according to a voltage level of the Q node or a voltage level of the QB node.

The Q node bootstrapper may bootstrap a voltage of the Q node when the gate signal is output.

According to one embodiment of the present disclosure, output differences between the gate signals output from the gate driver circuit are reduced. More specifically, each of the stage circuits included in the gate driver circuit in one embodiment of the present disclosure outputs a plurality of the gate signals such that output differences between the gate signals output from each stage circuit are reduced. Accordingly, an average value of output differences between the gate signals output from all of the stage circuits may be reduced. Therefore, the image display quality of the display device is improved.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
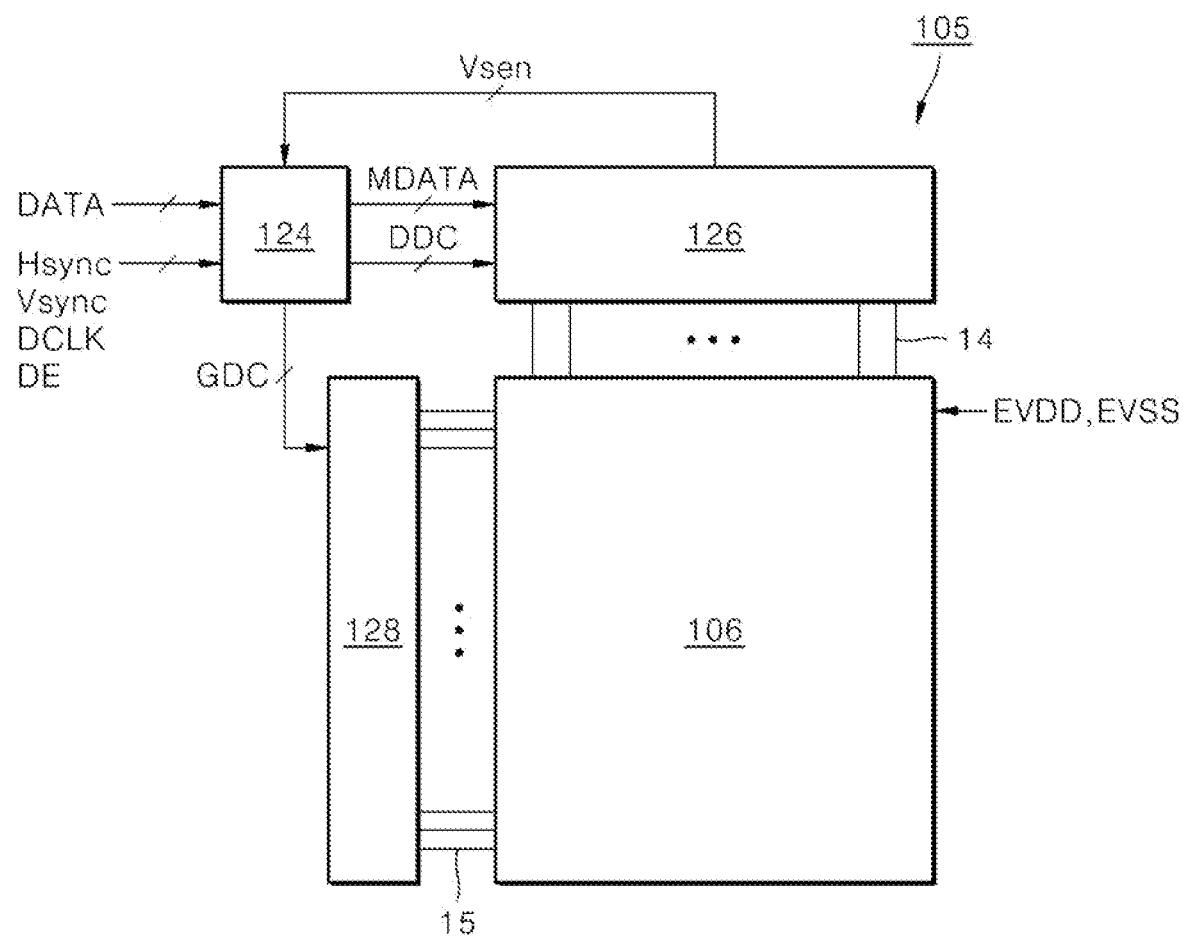
FIG. 1 is a block diagram showing a configuration of a display device according to one embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be within the spirit and scope of the present disclosure as defined by the appended claims.

A shape, a size, a ratio, an angle, a number, etc. disclosed in the drawings for describing an embodiments of the present disclosure are examples, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular may constitute "a" and "an" are intended to include the plural may constitute as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D," this means C inclusive to D inclusive unless otherwise specified.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The features of the various embodiments of the present disclosure can be partially or entirely combined with each other, and can be technically associated with each other or operate with each other. An embodiments can be implemented independently of each other and can be implemented together in an association relationship.

In interpreting a numerical value in the disclosure, an error range may be inherent even when there is no separate explicit description thereof.

In a description of a signal flow relationship, for example, when a signal is transmitted from a node A to a node B, the signal can be transmitted from the node A via a node C to the node B, unless an indication that the signal is transmitted directly from the node A to the node B is specified.

In accordance with the present disclosure, each of a sub-pixel circuit and a gate driver circuit formed on a substrate of a display panel can be embodied as a transistor of an n-type MOSFET structure. However, the disclosure is not limited thereto. Each of a sub-pixel circuit and a gate driver circuit formed on a substrate of a display panel can be embodied as a transistor of a p-type MOSFET structure. A transistor can include a gate, a source, and a drain. In the transistor, carriers can flow from the source to the drain. In an n-type transistor, the carrier is an electron and thus a source voltage can be lower than a drain voltage so that electrons can flow from the source to the drain. In an n-type transistor, electrons flow from the source to the drain. A current direction is a direction from the drain to the source. In a p-type transistor, the carrier is a hole. Thus, the source voltage can be higher than the drain voltage so that holes can flow from the source to the drain. In the p-type transistor, the holes flow from the source to the drain. Thus, a direction of current is a direction from the source to the drain. In the transistor of the MOSFET structure, the source and the drain may not be fixed, but can be changed according to an applied voltage. Accordingly, in the present disclosure, one of the source and the drain is referred to as a first source/drain electrode, and the other of the source and the drain is referred to as a second source/drain electrode.

Hereinafter, a preferred example of a gate driver circuit and a display device including the same according to the present disclosure will be described in detail with reference to the accompanying drawings. Across different drawings, the same elements can have the same reference numerals. Moreover, each of scales of components shown in the accompanying drawings is shown to be different from an actual scale for convenience of description. Thus, each of scales of components is not limited to a scale shown in the drawings.

Figure 2:
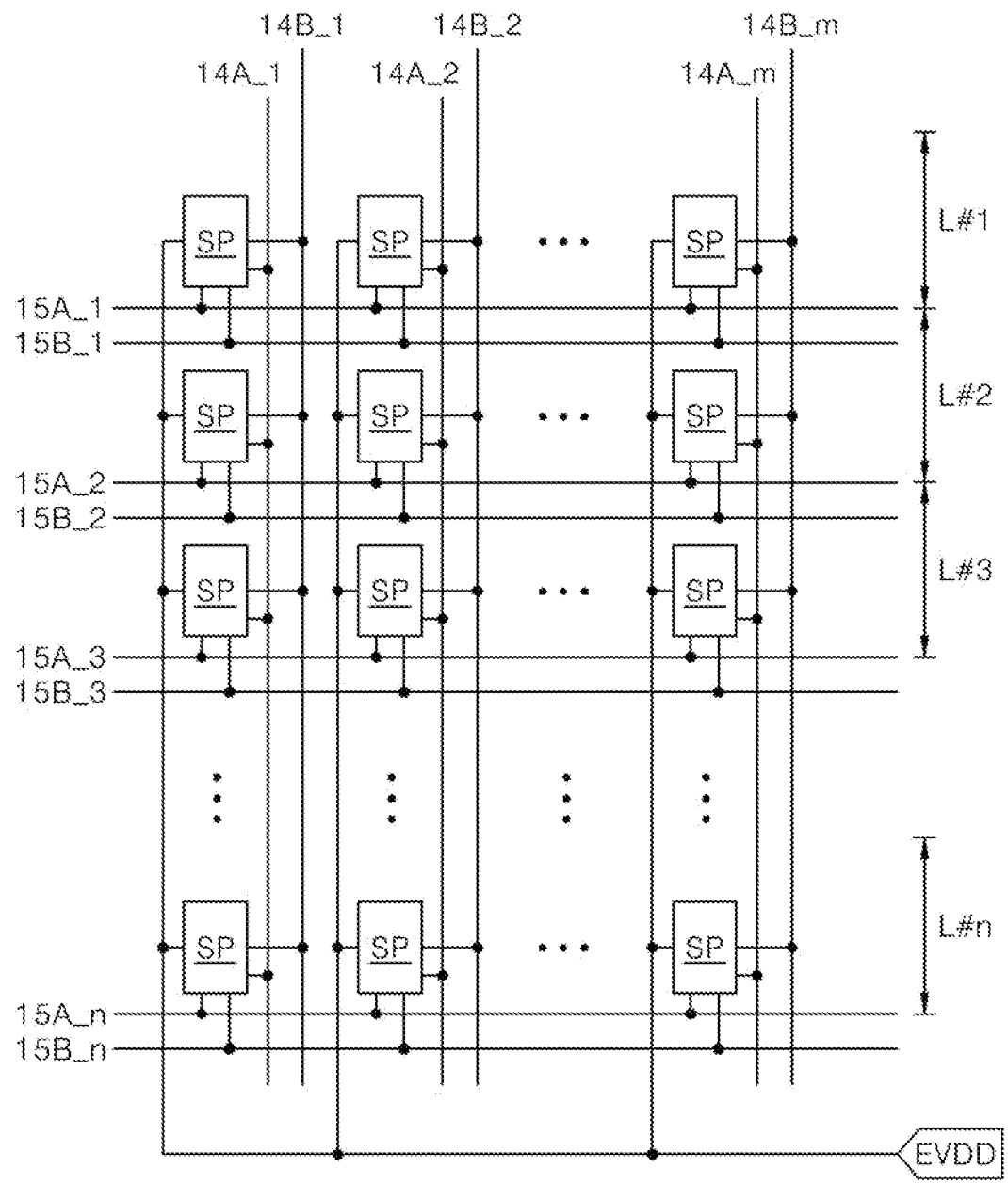
FIG. 2 shows a configuration of a sub-pixel array included in a display panel according to one embodiment of the present disclosure.

FIG. 1 is a block diagram showing a configuration of a display device according to one embodiment of the present disclosure. FIG. 2 shows a configuration of a sub-pixel array included in a display panel according to one embodiment of the present disclosure.

Referring to FIG. 1 and FIG. 2, a display device 105 according to one embodiment of the present disclosure includes a display panel 106, a data driver circuit 126, a gate driver circuit 128, and a timing controller 124.

A plurality of data lines 14 and a plurality of gate lines 15 are arranged to intersect each other and on the display panel 106. Further, sub-pixels SP are arranged in a matrix form and are respectively disposed at intersections between the data lines 14 and the gate lines 16.

The data lines 14 includes m data voltage supply lines 14A_1 to 14A_m (m being a positive integer) and m sensed voltage readout lines 14B_1 to 14B_m. Moreover, the gate lines 15 include n (n being positive integer) first gate lines 15A_1 to 15A_n and n second gate lines 15B_1 to 15B_n.

Each sub-pixel SP can be connected to one of the data voltage supply lines 14A_1 to 14A_m, one of the sensed voltage readout lines 14B_1 to 14B_m, one of the first gate lines 15A_1 to 15A_n, and one of the second gate lines 15B_1 to 15B_n. The sub-pixels SP can display different colors. A certain number of sub-pixel SPs can constitute one pixel P.

Each sub-pixel SP can receive a data voltage through the data voltage supply line, can receive a first gate signal through the first gate line, can receive a second gate signal through the second gate line, and can outputs a sensed voltage through the sensed voltage readout line.

That is, in the sub-pixel array shown in FIG. 2, the sub-pixels SP can operate on one horizontal line L #1 to L #n basis in response to the first gate signal supplied on a horizontal line basis from the first gate lines 15A_1 to 15A_n and the second gate signal supplied on a horizontal line basis from the second gate lines 15B_1 to 15B_n. Sub-pixels SP on the same horizontal line where a sensing operation is activated can receive a data voltage for sensing a threshold voltage from the data voltage supply lines 14A_1 to 14A_m and outputs a sensed voltage to the sensed voltage readout lines 14B_1 to 14B_m. Each of the first gate signal and the second gate signal can be a gate signal for sensing the threshold voltage or a gate signal for displaying an image, respectively. The present disclosure is not limited thereto.

Each sub-pixel SP can receive a high-potential voltage EVDD and a low-potential voltage EVSS from a power supply circuit. The sub-pixel SP can include an organic light emitting diode (OLED), a driving transistor, first and second switching transistors, and a storage capacitor. According to an embodiment, a light source other than the OLED can be included in the sub-pixel SP.

Each of the transistors constituting the sub-pixel SP can be implemented as a p-type or n-type transistor. Further, a semiconductor layer of each of the transistors constituting the sub-pixel SP can include amorphous silicon or polysilicon or an oxide.

During a sensing operation for sensing a threshold voltage of the driving transistor, the data driver circuit 126 can transmit a data voltage for sensing the threshold voltage to the sub-pixels SP, based on the first gate signal for sensing the threshold voltage supplied on a horizontal line basis and can convert a sensed voltage input from the display panel 106 via the sensed voltage readout lines 14B_1 to 14B_m into a digital value and can supply the digital value to the timing controller 124. During an image display operation for image display, the data driver circuit 126 converts compensated image data MDATA input from the timing controller 124 into a data voltage for image display based on a data control signal DDC, and supplies the converted data voltage to the data voltage supply lines 14A_1 to 14A_m.

The gate driver circuit 128 generates the gate signal based on a gate control signal GDC. The gate signal can include the first gate signal for sensing the threshold voltage, the second gate signal for sensing the threshold voltage, a first gate signal for displaying an image, and a second gate signal for displaying an image.

During the sensing operation, the gate driver circuit 128 can supply the first gate signal for sensing the threshold voltage to the first gate lines 15A_1 to 15A_n on a horizontal line basis, and can supply the second gate signal for sensing the threshold voltage to the second gate lines 15B_1 to 15B_n on a horizontal line basis. During the image display operation for image display, the gate driver circuit 128 can supply the first gate signal to display the image to the first gate lines 15A_1 to 15A_n on a horizontal line basis, and can supply the second gate signal to display the image to the second gate lines 15B_1 to 15B_n on a horizontal line basis. In one embodiment of the present disclosure, the gate driver circuit 128 can be disposed on the display panel 106 in a GIP (Gate-driver In Panel) scheme.

The timing controller 124 can generate and output the data control signal DDC for controlling an operation timing of the data driver circuit 126 and the gate control signal GDC for controlling an operation timing of the gate driver circuit 128, based on timing signals, such as a vertical synchronization signal Vsync, a horizontal synchronization signal Hsync, a dot clock signal DCLK, and a data enable signal DE. Further, the timing controller 124 compensates image data DATA with reference to a sensed value supplied from the data driver circuit 126 to generate compensated image data MDATA for compensating for a threshold voltage deviation of the driving transistor, and supplies the compensated image data MDATA to the data driver circuit 126.

Figure 3:
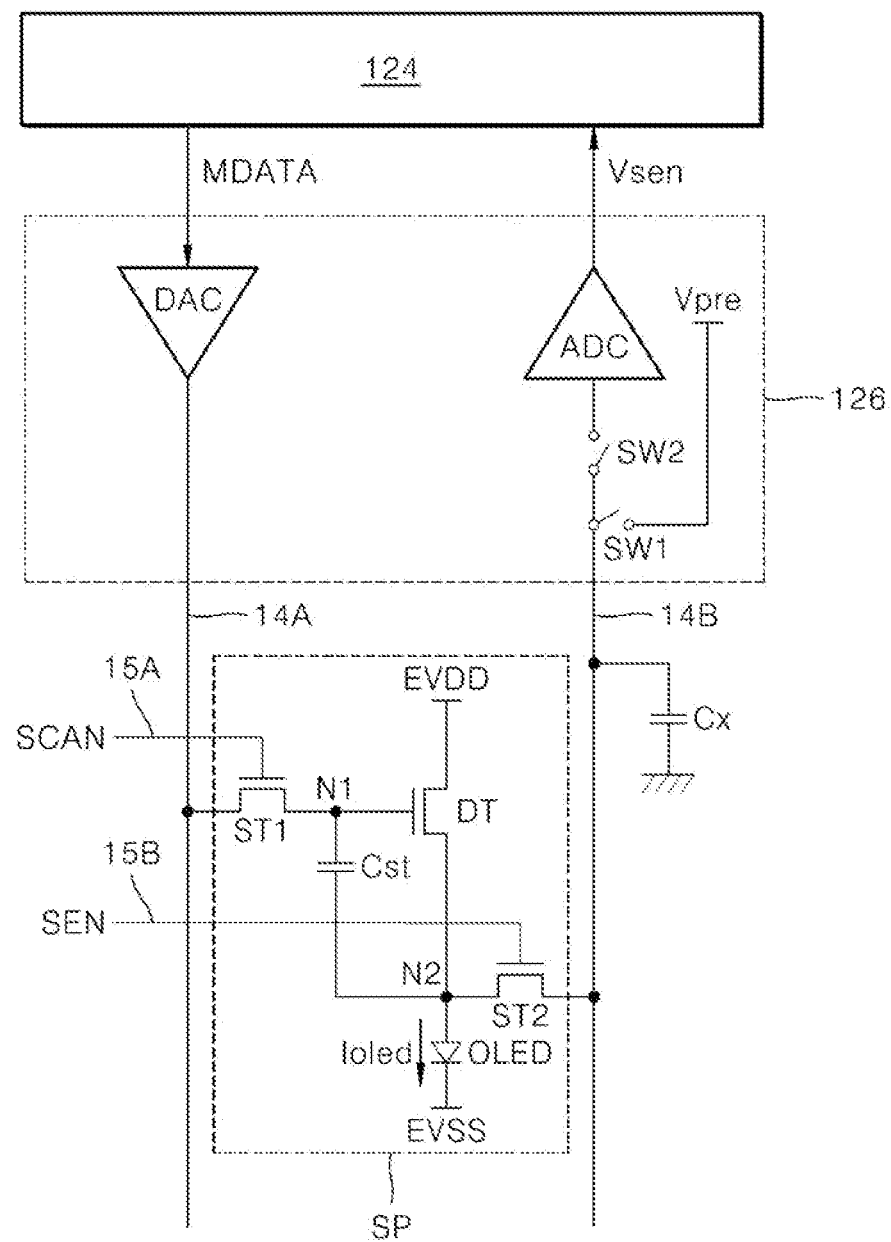
FIG. 3 shows a configuration of a sub-pixel circuit, and a connection structure between a timing controller, a data driver circuit, and a sub-pixel according to one embodiment of the present disclosure.

FIG. 3 shows a configuration of a sub-pixel circuit, and a connection structure between a timing controller, a data driver circuit, and a sub-pixel according to one embodiment of the present disclosure.

Referring to FIG. 3, the sub-pixel SP includes the OLED, the driving transistor DT, the storage capacitor Cst, the first switching transistor ST, and the second switching transistor ST2.

The OLED includes an anode connected to a second node N2, a cathode connected to an input side of a low-potential driving voltage EVSS, and an organic compound layer located between the anode and the cathode.

The driving transistor DT is turned on based on a gate-source voltage Vgs to control a current Ioled flowing through the OLED. The driving transistor DT includes a gate electrode connected to a first node N1, a drain electrode connected to an input side of a high-potential driving voltage EVDD, and a source electrode connected to the second node N2.

The storage capacitor Cst is connected to and disposed between the first node N1 and the second node N2.

The first switching transistor ST1 applies a data voltage Vdata for sensing a threshold voltage as charged in the data voltage supply line 14A to the first node N1 in response to the first gate signal SCAN for sensing the threshold voltage during the sensing operation. The first switching transistor ST1 applies a data voltage Vdata for displaying an image charged in the data voltage supply line 14A to the first node N1 in response to the first gate signal SCAN for displaying the image during an image display operation. The first switching transistor ST1 includes a gate electrode connected to the first gate line 15A, a drain electrode connected to the data voltage supply line 14A, and a source electrode connected to the first node N1.

The second switching transistor ST2 switches a current flow between the second node N2 and the sensed voltage readout line 14B in response to the second gate signal SEN for sensing the threshold voltage during the sensing operation such that a source voltage of the second node N2 which changes based on a gate voltage of the first node N1 is stored in a sensing capacitor Cx of the sensed voltage readout line 14B. The second switching transistor ST2 switches a current flow between the second node N2 and the sensed voltage readout line 14B in response to the second gate signal SEN for displaying the image during the image display operation to reset a source voltage of the driving transistor DT to an initialization voltage Vpre. The gate electrode of the second switching transistor ST2 can be connected to the second gate line 15B. The drain electrode of the second switching transistor ST2 can be connected to the second node N2. The source electrode of the second switching transistor ST2 can be connected to the sensed voltage readout line 14B.

The data driver circuit 126 is connected to the sub-pixel SP via the data voltage supply line 14A and the sensed voltage readout line 14B. The sensing capacitor Cx is connected to the sensed voltage readout line 14B to store therein a source voltage of the second node N2 as a sensed voltage Vsen. The data driver circuit 126 includes a digital-analog converter DAC, an analog-digital converter ADC, an initialization switch SW1, and a sampling switch SW2.

The DAC can generate the data voltage Vdata for sensing the threshold voltage at the same level or different levels for first and second periods of a sensing period under control of the timing controller 124 and output the generated data voltage to the data voltage supply line 14A. The DAC can convert the compensated image data MDATA to a data voltage Vdata for image display under control of the timing controller 124 for the image display period and output the converted data voltage to the data voltage supply line 14A.

The initialization switch SW1 switches current flow between an input side of the initialization voltage Vpre and the sensed voltage readout line 14B. The sampling switch SW2 switches current flow between the sensed voltage readout line 14B and the ADC. The ADC can convert an analog sensed voltage Vsen stored in the sensing capacitor Cx into a digital value and can supply the digital value to the timing controller 124.

A sensing operation process performed under control of the timing controller 124 is as follows. For the sensing operation, when the first and second gate signals SCAN and SEN for sensing the threshold voltage are applied to the sub-pixel SP while being at an on level Lon, the first switching transistor ST1 and the second switching transistor ST2 are turned on. In this connection, the initialization switch SW1 in the data driver circuit 126 is turned on.

When the first switching transistor ST1 is turned on, the data voltage Vdata for sensing the threshold voltage is supplied to the first node N1. When the initialization switch SW1 and the second switching transistor ST2 are turned on, the initialization voltage Vpre is supplied to the second node N2. In this connection, the voltage Vgs between the gate and the source of the driving transistor DT becomes larger than a threshold voltage Vth, such that a current Ioled flows between the drain and the source of the driving transistor DT. A source voltage VN2 of the driving transistor DT charged in the second node N2 can gradually increase due to this current Ioled. Thus, the source voltage VN2 of the driving transistor DT can follow a gate voltage VN1 of the driving transistor DT until the gate-source voltage Vgs of the driving transistor DT becomes the threshold voltage Vth.

The source voltage VN2 of the driving transistor DT charged in the second node N2 in the increasing manner is stored as the sensed voltage Vsen in the sensing capacitor Cx formed in the sensed voltage readout line 14B via the second switching transistor ST2. The sensed voltage Vsen can be detected when the sampling switch SW2 in the data driver circuit 12 is turned on within the sensing period for which the second gate signal SEN for sensing the threshold voltage is maintained at the on level, and then the sensed voltage Vsen as detected can be supplied to the ADC.

In one embodiment of the present disclosure, the timing controller 124 can control the data driver circuit 126 and the gate driver circuit 128 so that one frame of the image data is displayed during the image display operation and then the sensing operation is performed on one horizontal line before a next frame thereof is displayed.

Figure 4:
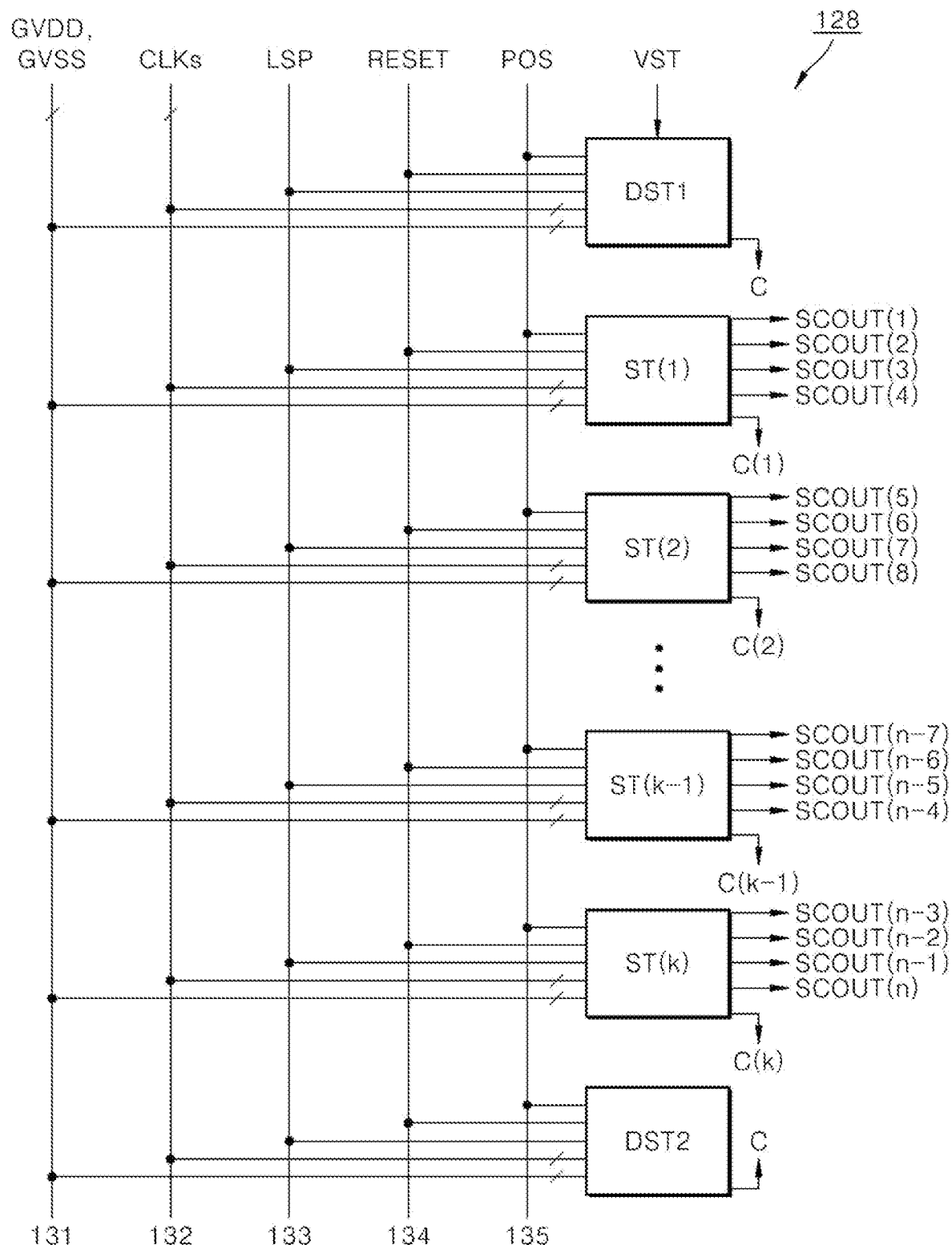
FIG. 4 shows a configuration of a plurality of stage circuits included in a gate driver circuit according to one embodiment of the present disclosure.

FIG. 4 shows a configuration of a plurality of stage circuits included in the gate driver circuit according to one embodiment of the present disclosure.

Referring to FIG. 4, the gate driver circuit 128 according to one embodiment of the present disclosure includes first to k-th stage circuits ST(1) to ST(k) (k is a positive integer), a gate driving voltage line 131, a clock signal line 132, a line sensing preparation signal line 133, and a reset signal line 134, and a panel on signal line 135. Further, the gate driver circuit 128 can further include a front dummy stage circuit DST1 disposed in front of the first stage circuit ST(1) and a rear dummy stage circuit DST2 disposed in rear of the k-th stage circuit ST(k).

The gate driving voltage line 131 can supply a high-potential voltage GVDD and a low-potential voltage GVSS supplied from a power supply circuit to each of the first to k-th stage circuits ST(1) to ST(k), the front dummy stage circuit DST1, and the rear dummy stage circuit DST2.

In one embodiment of the present disclosure, the gate driving voltage line 131 can include a plurality of high-potential voltage lines for supplying a plurality of high-potential voltages having different voltage levels, respectively, and a plurality of low-potential voltage lines for supplying a plurality of low-potential voltages having different voltage levels, respectively.

In one example, the gate driving voltage line 131 has three high-potential voltage lines for supplying a first high-potential voltage GVDD1, a second high-potential voltage GVDD2, and a third high-potential voltage GVDD3 having different voltage levels, respectively. The gate driving voltage line 131 has three low-potential voltage lines for supplying a first low-potential voltage GVSS1, a second low-potential voltage GVSS2, and a third low-potential voltage GVSS3 having different voltage levels, respectively. However, this is only one example. The number of the lines included in the gate driving voltage line 131 can vary based on embodiments.

The clock signal line 132 can supply a plurality of clock signals CLKs supplied from the timing controller 124, for example, a carry clock signal CRCLK or a scan clock signal SCCLK to each of the first to k-th stage circuits ST(1) to ST(k), the front dummy stage circuit DST1 and the rear dummy stage circuit DST2.

The line sensing preparation signal line 133 can supply a line sensing preparation signal LSP supplied from the timing controller 124 to the first to k-th stage circuits ST(1) to ST(k). Optionally, the line sensing preparation signal line 133 can be further connected to the front dummy stage circuit DST1.

The reset signal line 134 can supply a reset signal RESET supplied from the timing controller 124 to each of the first to k-th stage circuits ST(1) to ST(k), the front dummy stage circuit DST1, and the rear dummy stage circuit DST2.

The panel on signal line 135 can supply a panel on signal POS supplied from the timing controller 124 to each of the first to k-th stage circuits ST(1) to ST(k), the front dummy stage circuit DST1, and the rear dummy stage circuit DST2.

In addition, lines for supplying signals other than the lines 131, 132, 133, 134, and 135 as shown in FIG. 4 can be additionally connected to the first to k-th stage circuits ST(1) to ST(k), the front dummy stage circuit DST1, and the rear dummy stage circuit DST2. In one example, a line for supplying a gate start signal VST to the front dummy stage circuit DST1 can be additionally connected to the front dummy stage circuit DST1.

The front dummy stage circuit DST1 outputs a front carry signal C in response to an input of the gate start signal VST supplied from the timing controller 124. The front carry signal C can be supplied to one of the first to k-th stage circuits ST(1) to ST(k).

The rear dummy stage circuit DST2 outputs a rear carry signal C. The rear carry signal C can be supplied to one of the first to k-th stage circuits ST(1) to ST(k).

The first to k-th stage circuits ST(1) to ST(k) can be connected to each other in a cascaded manner or in a stepped manner.

In one embodiment of the present disclosure, each of the first to k-th stage circuits ST(1) to ST(k) outputs j (j is a positive integer) gate signals SCOUT and one carry signal CS. That is, each stage circuit outputs first to j-th gate signals and one carry signal CS.

For example, in an embodiment shown in FIG. 4, each stage circuit outputs four gate signals SCOUT and one carry signal C. For example, the first stage circuit ST(1) outputs a first gate signal SCOUT(1), a second gate signal SCOUT(2), a third gate signal SCOUT(3), a fourth gate signal SCOUT(4) and a first carry signal C(1). The second stage circuit ST 2 outputs a fifth gate signal SCOUT(5), a sixth gate signal SCOUT(6), a seventh gate signal SCOUT(7), an eighth gate signal SCOUT(8), and a second carry signal C(2). Therefore, in FIG. 4, j is 4.

The total number of the gate signals output from the first to k-th stage circuits ST(1) to ST(k) is equal to the number n of the gate lines 15 arranged on the display panel 106. As described above, each stage circuit outputs the j gate signals. Therefore, j×k=n is established.

For example, in the embodiment shown in FIG. 4 in which j=4, the number k of the stage circuits is equal to ¼ of the number n of the gate lines 15. That is, in the embodiment of FIG. 4, k=n/4.

However, the number of the gate signals output from each stage circuit is not limited thereto. That is, in another embodiment of the present disclosure, each stage circuit can output one, two, or threes gate signals, or can output five or more gate signals. The number of the stage circuits can vary according to the number of the gate signals output from each stage circuit.

Hereinafter, an embodiment in which each stage circuit outputs four gate signals SCOUT and one carry signal C will be described. However, the present disclosure is not limited to this embodiment.

Each of the gate signals SCOUT output from the first to k-th stage circuits ST(1) to ST(k) can act as the gate signal for sensing the threshold voltage or the gate signal for displaying the image. Further, each carry signal C output from each of the first to k-th stage circuits ST(1) to ST(k) can be supplied to a stage circuit other than each stage circuit. In accordance with the present disclosure, a carry signal which one stage circuit receives from the front stage circuit can be referred to as the front carry signal, while a carry signal which one stage circuit receives from the rear stage circuit can be referred to as the rear carry signal.

Figure 5:
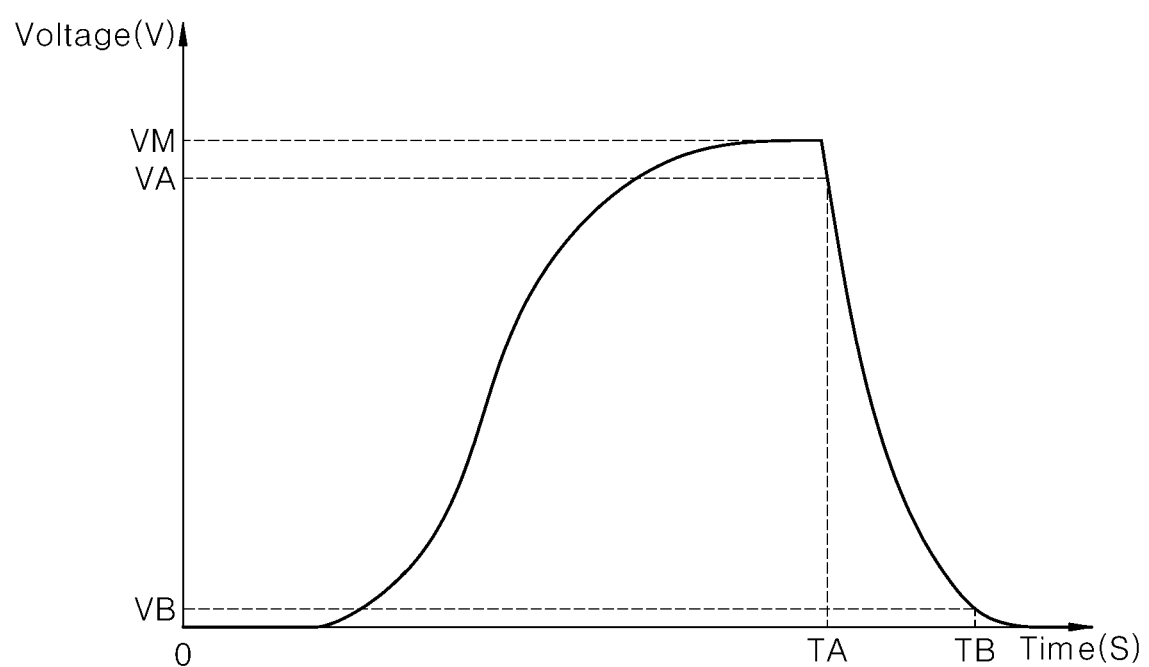
FIG. 5 shows a falling time of a gate signal according to an embodiment of the present disclosure.

FIG. 5 shows a falling time of the gate signal.

The gate signal output from the stage circuit according to one embodiment of the present disclosure can represent a voltage waveform as shown in FIG. 5. In accordance with the present disclosure, the falling time of the gate signal means a time duration it takes for a voltage value of the gate signal to change from a predetermined first reference value to a predetermined second reference value.

For example, the falling time of the gate signal shown in FIG. 5 can be defined as a time duration (TB-TA) required for a voltage value of the gate signal to change from a first voltage value VA, as 90% of a maximum value VM thereof, to a second voltage value VB, as 10% of the maximum value VM.

However, reference values (a first reference value and a second reference value used to measure the falling time of the gate signal can vary based on embodiments. For example, in another embodiment of the present disclosure, the first reference value can be set to the maximum value VM of the voltage value of the gate signal, while the second reference value can be set to a minimum value of the voltage value of the gate signal, for example, 0V of the gate signal shown in FIG. 5. According to embodiments, the minimum value of the voltage value of the gate signal can be a negative value.

Therefore, when the voltage value of each gate signal or a time duration of each gate signal varies, the falling time of each gate signal can vary.

Figure 6:
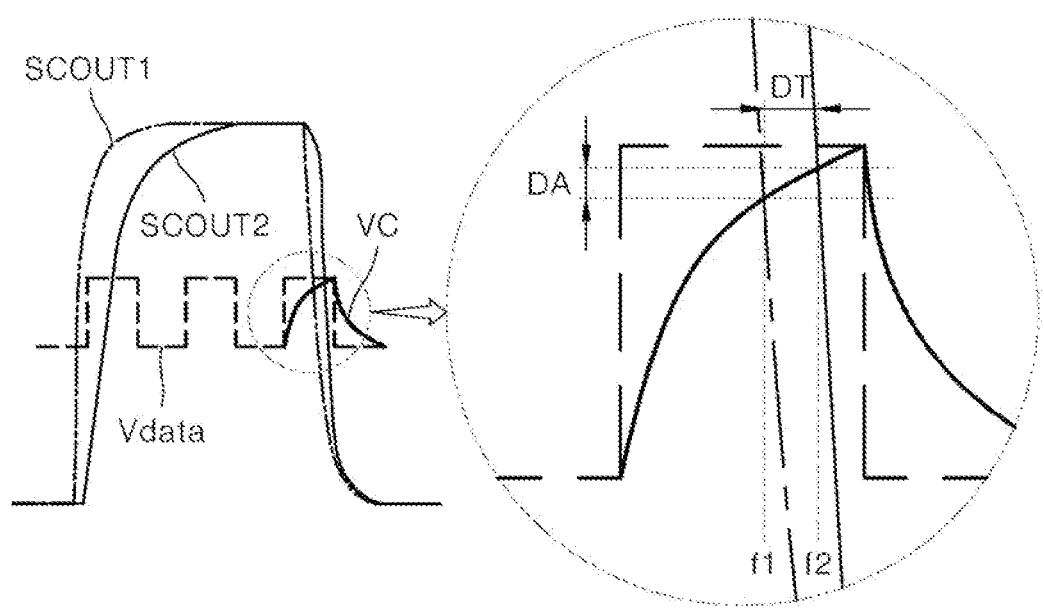
FIG. 6 shows two gate signals having different falling times, and magnitudes of voltages respectively charged to sub-pixels via the two gate signals according to an embodiment of the present disclosure.

FIG. 6 shows two gate signals having different falling times, and magnitudes of voltages respectively charged to sub-pixels via the two gate signals.

FIG. 6 shows two gate signals input to two different gate lines, that is, a first gate signal SCOUT1 and a second gate signal SCOUT2, respectively. As shown, a falling time of the first gate signal SCOUT1 and a falling time of the second gate signal SCOUT2 are different from each other.

Further, FIG. 6 shows a waveform of each of two voltages respectively charged to two different sub-pixels, that is, each charged voltage VC when data voltages Vdata of the same magnitude are respectively charged to the two different sub-pixels respectively belonging to the two different gate lines.

In FIG. 6, f1 represents a falling edge point of the first gate signal SCOUT1, and f2 represents a falling edge point of the second gate signal SCOUT2. Since the falling time of the first gate signal SCOUT1 and the falling time of the second gate signal SCOUT2 are different from each other, the falling edge point f1 of the first gate signal SCOUT1 and the falling edge point f2 of the second gate signal SCOUT2 are different from each other.

In one example, charging of the data voltage Vdata to each sub-pixel is terminated at the falling edge point of the gate signal. Therefore, a difference between the falling edge point f1 of the first gate signal SCOUT1 and the falling edge point f2 of the second gate signal SCOUT2 can be proportional to a difference between a charging time duration for which the data voltage Vdata is charged based on the first gate signal SCOUT1 and a charging time duration for which the data voltage Vdata is charged based on the second gate signal SCOUT2. Further, a difference between a charging time duration for which the data voltage Vdata is charged based on the first gate signal SCOUT1 and a charging time duration for which the data voltage Vdata is charged based on the second gate signal SCOUT2 can be proportional to a difference between a magnitude of a voltage charged to the sub-pixel based on the first gate signal SCOUT1 and a magnitude of a voltage charged to the sub-pixel based on the gate signal SCOUT2.

As shown in FIG. 6, due to the difference between the falling edge point f1 of the first gate signal SCOUT1 and the falling edge point f2 of the second gate signal SCOUT2, a difference DT between a charging time duration for which the data voltage Vdata is charged based on the first gate signal SCOUT1 and a charging time duration for which the data voltage Vdata is charged based on the second gate signal SCOUT2 occurs. Due to the difference DT between the charging time durations, a difference DA between the magnitudes of the charged voltages respectively charged to the sub-pixels occurs.

Eventually, when the same data voltage Vdata is charged to two sub-pixels respectively connected to different gate lines, and when an output difference between the gate signals respectively supplied to the two gate lines occurs, the difference DA between the magnitudes or amounts of the charged voltages respectively charged to two sub-pixels can occur. Due to the difference DA between the magnitudes or amounts of the charged voltages respectively charged to two sub-pixels, a difference in terms of color or brightness between an image of one line and an image of another line can be recognized as a line defect to a viewer when the image is displayed from the display device (e.g., if nearby display lines are supposed to show the same color at the same brightness, such as for a solid red shirt on an actor, then portions/lines of the solid red shirt may erroneously appear too dark or too bright, even though a uniform solid red shirt is intended according to the original data).

Therefore, the smaller the output difference between the gate signals respectively supplied to the gate lines, the better the image display quality of the display device. In this connection, the output difference between the gate signals can vary based on the voltage magnitude, the time duration, or the falling time of each of the gate signals.

Hereinafter, embodiments of a stage circuit capable of reducing the output difference between the gate signals respectively supplied to the gate lines are described.

Figure 7:
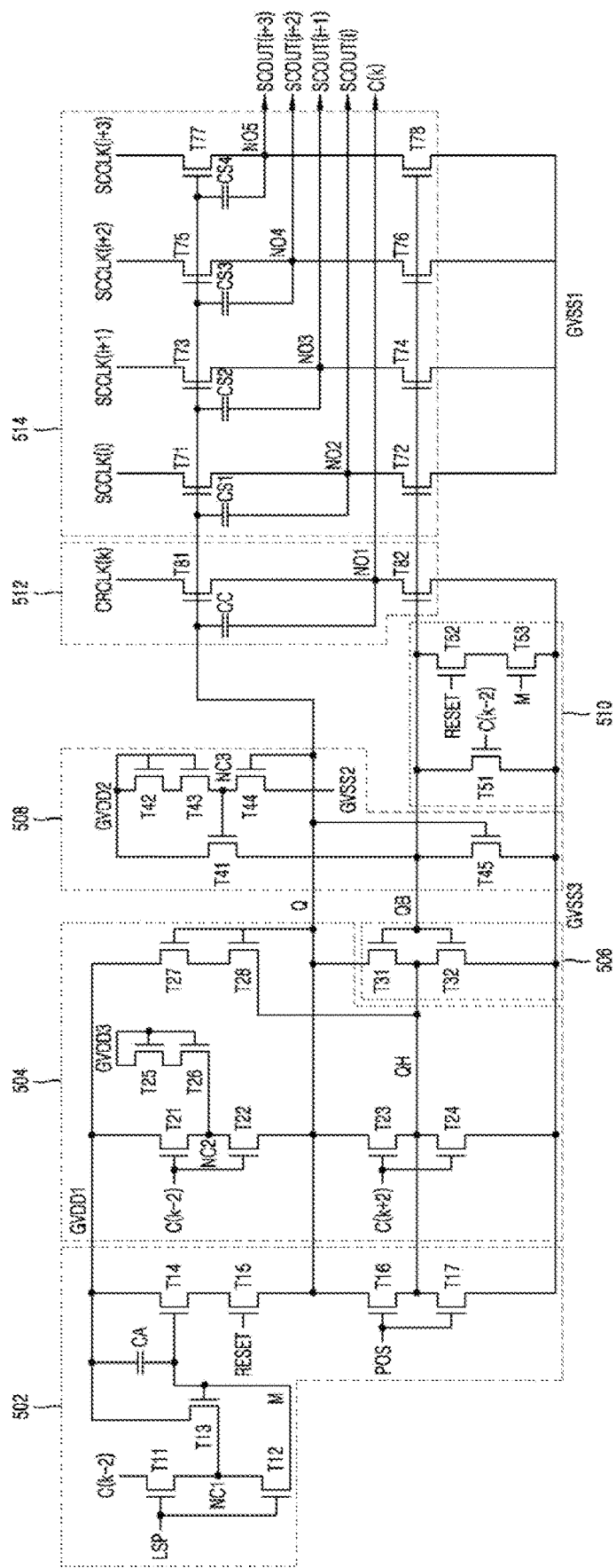
FIG. 7 is a circuit diagram of a stage circuit according to one embodiment of the present disclosure.

FIG. 7 is a circuit diagram of a stage circuit according to one embodiment of the present disclosure.

The stage circuit shown in FIG. 7 can be one stage circuit among the first to k-th stage circuits ST(1) to ST(k) shown in FIG. 4.

Referring to FIG. 7, the stage circuit according to one embodiment of the present disclosure includes an M node, a Q node, and a QB node. Further, the stage circuit according to one embodiment of the present disclosure includes a line selector 502, a Q node controller 504, a Q node and QH node stabilizer 506, an inverter 508, a QB node stabilizer 510, a carry signal output module 512 (e.g., carry signal output circuit portion), and a gate signal output module 514 (e.g., gate signal output circuit portion).

The line selector 502 charges the M node based on the front carry signal C(k−2) in response to an input of the line sensing preparation signal LSP. Further, the line selector 502 charges the Q node to a first high-potential voltage GVDD1 level based on a charged voltage of the M node in response to an input of the reset signal RESET. Further, the line selector 502 discharges or resets the Q node to a third low-potential voltage GVSS3 level in response to an input of the panel on signal POS.

The line selector 502 includes first to seventh transistors T11 to T17 and a pre-charging capacitor CA.

The first transistor T11 and the second transistor T12 are connected to and disposed between a first high-potential voltage line for delivering the first high-potential voltage GVDD1 and the M node. Further, the first transistor T11 and the second transistor T12 are connected in series with each other.

The first transistor T11 outputs a front carry signal C(k−2) to a first connection node NC1 in response to an input of the line sensing preparation signal LSP. The second transistor T12 electrically connects the first connection node NC1 to the M node in response to an input of the line sensing preparation signal LSP. For example, when the line sensing preparation signal LSP of a high level voltage is input to the first transistor T11 and the second transistor T12, the first transistor T11 and the second transistor T12 are simultaneously turned on to charge the M node to the first high-potential voltage GVDD1 level.

A third transistor T13 can be turned on when a voltage level of the M node is at a high level, and thus can supply the first high-potential voltage GVDD1 to the first connection node NC1. When the first high-potential voltage GVDD1 is supplied to the first connection node NC1, a difference between a gate voltage of the first transistor T11 and a voltage of the first connection node NC1 increases. Therefore, when the line sensing preparation signal LSP of a low level voltage is input to a gate of the first transistor T11 such that the first transistor T11 is turned off, the first transistor T11 can be maintained in a completely turned off state due to the difference between the gate voltage of the first transistor T11 and the voltage of the first connection node NC1. Accordingly, current leakage of the first transistor T11 is prevented and thus, voltage drop of the M node can be prevented, so that the voltage of the M node can be stably maintained.

The pre-charging capacitor CA is connected to and disposed between the first high-potential voltage line for delivering the first high-potential voltage GVDD1 and the M node, and stores therein a voltage corresponding to a difference between the first high-potential voltage GVDD1 and a voltage charged to the M node. When the first transistor T11, the second transistor T12, and the third transistor T13 are turned on, the pre-charging capacitor CA stores therein a high level voltage of the front carry signal C(k−2). When the first transistor T11, the second transistor T12, and the third transistor T13 are turned off, the pre-charging capacitor CA maintains the voltage of the M node using the voltage stored therein for a certain period of time.

A fourth transistor T14 and a fifth transistor T15 are connected to and disposed between the Q node and the first high-potential voltage line for delivering the first high-potential voltage GVDD1. The fourth transistor T14 and the fifth transistor T15 are connected in series with each other.

The fourth transistor T14 and the fifth transistor T15 charge the Q node to the first high-potential voltage GVDD1 in response to the voltage of the M node and an input of the reset signal RESET. The fourth transistor T14 can be turned on when the voltage of the M node is at a high level, and thus can transmit the first high-potential voltage GVDD1 to a shared node between the fourth transistor T14 and the fifth transistor T15. The fifth transistor T15 can be turned on based on a high level reset signal RESET to supply the voltage of the shared node to the Q node. Therefore, when the fourth transistor T14 and the fifth transistor T15 are simultaneously turned on, the Q node is charged with the first high-potential voltage GVDD1.

A sixth transistor T16 and a seventh transistor T17 are connected to and disposed between the Q node and a third low-potential voltage line that can transmit the third low-potential voltage GVSS3. The sixth transistor T16 and the seventh transistor T17 are connected in series to each other.

The sixth transistor T16 and the seventh transistor T17 discharge the Q node to the third low-potential voltage GVSS3 in response to an input of the panel on signal POS. The Q node being discharged to the third low-potential voltage GVSS3 can also be referred to as the Q node being reset. The seventh transistor T17 can be turned on based on an input of a high level panel on signal POS to supply the third low-potential voltage GVSS3 to the QH node. The sixth transistor T16 is turned on according to an input of the high level panel-on signal POS to electrically connect the Q node and the QH node to each other. Therefore, when the sixth transistor T16 and the seventh transistor T17 are simultaneously turned on, the Q node is discharged or reset to the third low-potential voltage GVSS3.

The Q node controller 504 charges the Q node to the first high-potential voltage GVDD1 level, in response to an input of the front carry signal C(k−2), and discharges the Q node to the third low-potential voltage GVSS3 level, in response to an input of the rear carry signal C(k+2).

The Q node controller 504 includes first to eighth transistors T21 to T28.

The first transistor T21 and the second transistor T22 are connected to and disposed between the Q node and the first high-potential voltage line for delivering the first high-potential voltage GVDD1. The first transistor T21 and the second transistor T22 are connected in series with each other.

The first transistor T21 and the second transistor T22 charge the Q node to the first high-potential voltage GVDD1 level in response to an input of the front carry signal C(k−2). The first transistor T21 can be turned on according to an input of the front carry signal C(k−2) and thus can supply the first high-potential voltage GVDD1 to the second connection node NC2. The second transistor T22 can be turned on according to an input of the front carry signal C(k−2) and can electrically connect the second connection node NC2 and the Q node to each other. Therefore, when the first transistor T21 and the second transistor T22 are simultaneously turned on, the first high-potential voltage GVDD1 is supplied to the Q node.

A fifth transistor T25 and a sixth transistor T26 are connected to the third high-potential voltage line for delivering the third high-potential voltage GVDD3. The fifth transistor T25 and the sixth transistor T26 supply the third high-potential voltage GVDD3 to a second connection node NC2 in response to the third high-potential voltage GVDD3.

The fifth transistor T25 and the sixth transistor T26 are turned on at the same time based on the third high-potential voltage GVDD3, such that the third high-potential voltage GVDD3 is constantly supplied to the second connection node NC2, thereby increasing a difference between the gate voltage of the first transistor T21 and a voltage of the second connection node NC2. Therefore, when a low level front carry signal C(k−2) is input to the gate of the first transistor T21 and thus, the first transistor T21 is turned off, the first transistor T21 can be maintained in a completely turned-off state due to the difference between the gate voltage of the first transistor T21 and the voltage of the second connection node NC2. Accordingly, the current leakage of the first transistor T21 is prevented and thus, the voltage drop of the Q node can be prevented, so that the voltage of the Q node can be stably maintained.

In one example, when a threshold voltage of the first transistor T21 is negative (−), the gate-source voltage Vgs of the first transistor T21 is maintained to be negative (−) due to the third high-potential voltage GVDD3 supplied to the drain electrode. Therefore, when the low level front carry signal C(k−2) is input to the gate of the first transistor T21 and thus the first transistor T21 is turned off, the first transistor T21 can be maintained in a completely turned off state to prevent the leakage current therefrom.

In one embodiment of the present disclosure, the third high-potential voltage GVDD3 is set to a lower voltage level than that of the first high-potential voltage GVDD1.

A third transistor T23 and a fourth transistor T24 are connected to and disposed between the Q node and the third low-potential voltage line for delivering the third low-potential voltage GVSS3. The third transistor T23 and the fourth transistor T24 are connected in series with each other.

The third transistor T23 and the fourth transistor T24 discharge the Q node and the QH node to the third low-potential voltage GVSS3 level in response to an input of the rear carry signal C(k+2). The fourth transistor T24 is turned on according to an input of the rear carry signal C(k+2) to discharge the QH node to the third low-potential voltage GVSS3 level. The third transistor T23 is turned on according to an input of the rear carry signal C(k+2) to electrically connect the Q node and the QH node to each other. Therefore, when the third transistor T23 and the fourth transistor T24 are simultaneously turned on, each of the Q node and the QH node is discharged or reset to the third low-potential voltage GVSS3 level.

A seventh transistor T27 and an eighth transistor T28 are connected to and disposed between the first high-potential voltage line for delivering the first high-potential voltage GVDD1 and the Q node, and are connected to and disposed between the first high-potential voltage line for delivering the first high-potential voltage GVDD1 and the QH node. The seventh transistor T27 and the eighth transistor T28 are connected in series with each other.

The seventh transistor T27 and the eighth transistor T28 supply the first high-potential voltage GVDD1 to the QH node in response to the voltage of the Q node. The seventh transistor T27 can be turned on when the voltage of the Q node is at a high level and thus can supply the first high-potential voltage GVDD1 to a shared node between the seventh transistor T27 and the eighth transistor T28. The eighth transistor T28 can be turned on when the voltage of the Q node is at a high level and thus can electrically connect the shared node and the QH node to each other. Therefore, the seventh transistor T27 and the eighth transistor T28 are simultaneously turned on when the voltage of the Q node is at a high level, such that the first high-potential voltage GVDD1 is supplied to the QH node.

When the first high-potential voltage GVDD1 is supplied to the QH node, a difference between the gate voltage of the third transistor T23 and the voltage of the QH node increases. Therefore, when the low level rear carry signal C(k+2) is input to the gate of the third transistor T23 and thus the third transistor T23 is turned off, the third transistor T23 can be maintained in a completely turned off state due to the difference between the gate voltage of the third transistor T23 and the voltage of the QH node. Accordingly, current leakage of the third transistor T23 is prevented and thus, the voltage drop of the Q node can be prevented, so that the voltage of the Q node can be stably maintained.

The Q node and QH node stabilizer 506 discharges the Q node and the QH node to the third low-potential voltage GVSS3 level in response to the voltage of the QB node.

The Q node and QH node stabilizer 506 includes a first transistor T31 and a second transistor T32. The first transistor T31 and the second transistor T32 are connected to and disposed between the Q node and the third low-potential voltage line for delivering the third low-potential voltage GVSS3. The first transistor T31 and the second transistor T32 are connected in series with each other.

The first transistor T31 and the second transistor T32 discharge the Q node and the QH node to the third low-potential voltage GVSS3 level in response to the voltage of the QB node. The second transistor T32 can be turned on when the voltage of the QB node is at a high level and thus can supply the third low-potential voltage GVSS3 to a shared node between the first transistor T31 and the second transistor T32. The first transistor T31 can be turned on when the voltage of the QB node is at a high level and thus can electrically connect the Q node and the QH node to each other. Therefore, when the first transistor T31 and the second transistor T32 are turned on simultaneously in response to the voltage of the QB node, each of the Q node and the QH node can be discharged or reset to the third low-potential voltage GVSS3 level.

The inverter 508 changes a voltage level of the QB node according to a voltage level of the Q node.

The inverter 508 includes first to fifth transistors T41 to T45.

A second transistor T42 and a third transistor T43 are connected to and disposed between a second high-potential voltage line for delivering the second high-potential voltage GVDD2 and a third connection node NC3. The second transistor T42 and the third transistor T43 are connected in series with each other.

The second transistor T42 and the third transistor T43 supply the second high-potential voltage GVDD2 to the third connection node NC3 in response to the second high-potential voltage GVDD2. The second transistor T42 is turned on based on the second high-potential voltage GVDD2 to supply the second high-potential voltage GVDD2 to a shared node between the second transistor T42 and the third transistor T43. The third transistor T43 is turned on based on the second high-potential voltage GVDD2 to electrically connect the shared node between the second transistor T42 and the third transistor T43 to the third connection node NC3. Therefore, when the second transistor T42 and the third transistor T43 are simultaneously turned on based on the second high-potential voltage GVDD2, the third connection node NC3 is charged to the second high-potential voltage GVDD2 level.

The fourth transistor T44 is connected to and disposed between the third connection node NC3 and the second low-potential voltage line for delivering the second low-potential voltage GVSS2.

The fourth transistor T44 can supply the second low-potential voltage GVSS2 to the third connection node NC3 in response to a voltage of the Q node. The fourth transistor T44 can be turned on when the voltage of the Q node is at a high level and thus can discharge or reset the third connection node NC3 to the second low-potential voltage GVSS2.

The first transistor T41 is connected to and disposed between the second high-potential voltage line for delivering the second high-potential voltage GVDD2 and the QB node.

The first transistor T41 can supply the second high-potential voltage GVDD2 to the QB node in response to a voltage of the third connection node NC3.

The first transistor T41 can be turned on when the voltage of the third connection node NC3 is at a high level and thus can charge the QB node to the second high-potential voltage GVDD2 level.

The fifth transistor T45 is connected to and disposed between the QB node and the third low-potential voltage line for delivering the third low-potential voltage GVSS3.

The fifth transistor T45 can supply the third low-potential voltage GVSS3 to the QB node in response to a voltage of the Q node. The fifth transistor T45 can be turned on when the voltage of the Q node is at a high level and thus can discharge or reset the QB node to the third low-potential voltage GVSS3 level.

The QB node stabilizer 510 discharges the QB node to the third low-potential voltage GVSS3 level in response to an input of the rear carry signal C(k−2), to an input of the reset signal, and to a charged voltage of the M node.

The QB node stabilizer 510 includes first to third transistors T51 to T53.

The first transistor T51 is connected to and disposed between the QB node and the second low-potential voltage line for delivering the third low-potential voltage GVSS3.

The first transistor T51 can supply a third low-potential voltage GVSS3 to the QB node in response to an input of the rear carry signal C(k−2). The fifth transistor T45 can be turned on when the voltage of the Q node is at a high level and thus can discharge or reset the QB node to the third low-potential voltage GVSS3 level.

The second transistor T52 and the third transistor T53 are connected to and disposed between the QB node and the third low-potential voltage line for delivering the third low-potential voltage GVSS3. The second transistor T52 and the third transistor T53 are connected in series with each other.

The second transistor T52 and the third transistor T53 discharge the QB node to the third low-potential voltage GVSS3 level in response to an input of the reset signal and a charged voltage of the M node. The third transistor T53 can be turned on when the voltage of the M node is at a high level and thus can supply the third low-potential voltage GVSS3 to a shared node between the second transistor T52 and the third transistor T53. The second transistor T52 can be turned on based on an input of the reset signal RESET, such that the shared node between the second transistor T52 and the third transistor T53 is electrically connected to the QB node. Therefore, when the reset signal RESET is input to the second transistor T52 and the third transistor T53 while the voltage of the M node is at a high level, the second transistor T52 and the third transistor T53 are turned on at the same time to discharge or reset the QB node to the third low-potential voltage GVSS2 level.

The carry signal output module 512 outputs the carry signal C(k) based on a voltage level of the carry clock signal CRCLK(k) or the third low-potential voltage GVSS3 level, according to a voltage level of the Q node or a voltage level of the QB node.

The carry signal output module 512 includes a first transistor T81, a second transistor T82, and a boosting capacitor CC.

The first transistor T81 is connected to and disposed between a clock signal line for delivering the carry clock signal CRCLK(k) and a first output node NO1. The boosting capacitor CC is connected to and disposed between a gate and a source of the first transistor T81.

The first transistor T81 outputs a high level voltage carry signal C(k) through the first output node NO1, based on the carry clock signal CRCLK(k), in response to a voltage of the Q node. The first transistor T81 can be turned on when the voltage of the Q node is at a high level and thus can supply the carry clock signal CRCLK(k) of a high level voltage to the first output node NO1. Accordingly, the high level voltage carry signal C(k) is output.

When the carry signal C(k) is output, the boosting capacitor CC bootstraps a voltage of the Q node to a boosting voltage level higher than the first high-potential voltage GVDD1 level while being in synchronization with the carry clock signal CRCLK(k) of the high level voltage level.

When the voltage of the Q node is bootstrapped, the high voltage level carry clock signal CRCLK(k) can be output as the carry signal C(k) quickly and without distortion.

The second transistor T82 is connected to and disposed between the first output node NO1 and the third low-potential voltage line for delivering the third low-potential voltage GVSS3.

The second transistor T82 outputs a low level voltage carry signal C(k) through the first output node NO1, based on the third low-potential voltage GVSS3, in response to a voltage of the QB node. The second transistor T82 can be turned on when the voltage of the QB node is at a high level and thus can supply the third low-potential voltage GVSS3 to the first output node NO1. Accordingly, the low level voltage carry signal C(k) is output.

The gate signal output module 514 can output a plurality of the gate signals SCOUT(i), SCOUT(i+1), SCOUT(i+2), and SCOUT(i+3), based on voltage levels of a plurality of scan clock signals SCCLK(i), SCCLK(i+1), SCCLK(i+2), and SCCLK(i+3), or the first low-potential voltage GVSS1 level, according to a voltage level of the Q node or a voltage level of the QB node. In this connection, i is a positive integer.

The gate signal output module 514 includes first to eighth transistors T71 to T78, and boosting capacitors CS1, CS2, CS3, and CS4.

A first transistor T71, a third transistor T73, a fifth transistor T75, and a seventh transistor T77 are respectively connected to and disposed between the QB node and clock signal lines for respectively delivering scan clock signals SCCLK(i), SCCLK(i+1), SCCLK(i+2) and SCCLK(i+3). Each of the boosting capacitors CS1, CS2, CS3, and CS4 is connected to and disposed between a gate and a source of each of the first transistor T71, the third transistor T73, the fifth transistor T75, and the seventh transistor T77.

Each of the first transistor T71, the third transistor T73, the fifth transistor T75, and the seventh transistor T77 outputs each of high level voltage gate signals SCOUT(i), SCOUT(i+1), SCOUT(i+2), and SCOUT(i+3) via each of a second output node NO2, a third output node NO3, a fourth output node NO4, and a fifth output node NO5, based on each of the scan clock signals SCCLK(i), SCCLK(i+1), SCCLK(i+2), and SCCLK(i+3), and in response to a voltage of the Q node. Each of the first transistor T71, the third transistor T73, the fifth transistor T75, and the seventh transistor T77 is turned on when the voltage of the Q node is at a high level and thus can supply each of the high level voltage scan clock signals SCCLK(i), SCCLK(i+1), SCCLK(i+2), and SCCLK(i+3) to each of the second output node NO2, the third output node NO3, the fourth output node NO4, and the fifth output node NO5. Accordingly, the high level voltage gate signals SCOUT(i), SCOUT(i+1), SCOUT(i+2), and SCOUT(i+3) are respectively output.

When the gate signals SCOUT(i), SCOUT(i+1), SCOUT(i+2), SCOUT(i+3) are respectively output, the boosting capacitors CS1, CS2, CS3, and CS4 bootstrap or increase the voltage of the Q node to a boosting voltage level higher than the first high-potential voltage GVDD1 level, while being respectively synchronized with the high level voltage scan clock signals SCCLK(i), SCCLK(i+1), SCCLK(i+2), and SCCLK(i+3). When the voltage of the Q node is bootstrapped, the high voltage level scan clock signals SCCLK(i), SCCLK(i+1), SCCLK(i+2), and SCCLK(i+3) can be respectively output as the gate signals SCOUT(i), SCOUT(i+1), SCOUT(i+2), and SCOUT(i+3) quickly and without distortion.

A second transistor T72, a fourth transistor T74, a sixth transistor T76, and an eighth transistor T78 respectively output low level voltage gate signals SCOUT(i), SCOUT(i+1), SCOUT(i+2), and SCOUT(i+3) respectively via the second output node NO2, the third output node NO3, the fourth output node NO4, and the fifth output node NO5, based on the first low-potential voltage GVSS1 and in response to a voltage of the QB node. The second transistor T72, the fourth transistor T74, the sixth transistor T76, and the eighth transistor T78 can be respectively turned on when the voltage of the QB node is at a high level and thus can supply the first low-potential voltage GVSS1 to the second output node NO2, the third output node NO3, the fourth output node NO4, and the fifth output node NO5, respectively. Accordingly, the low level voltage gate signals SCOUT(i), SCOUT(i+1), SCOUT(i+2), and SCOUT(i+3) are respectively output.

In the embodiment shown in FIG. 7, each stage circuit can receive the three high-potential voltages GVDD1, GVDD2, and GVDD3 set to different levels, and the three low-potential voltages GVSS1, GVSS2, and GVSS3 set to different levels. For example, the first high-potential voltage GVDD1 can be set to 20V, the second high-potential voltage GVDD2 can be set to 16V, and the third high-potential voltage GVDD3 can be set to 14V. The first low-potential voltage GVSS1 can be set to −6V, the second low-potential voltage GVSS2 can be set to −10V, and the third low-potential voltage GVSS3 can be set to −12V. These numerical values are just one example. The levels of the high-potential voltages and the low-potential voltage can vary based on embodiments.

Figure 8:
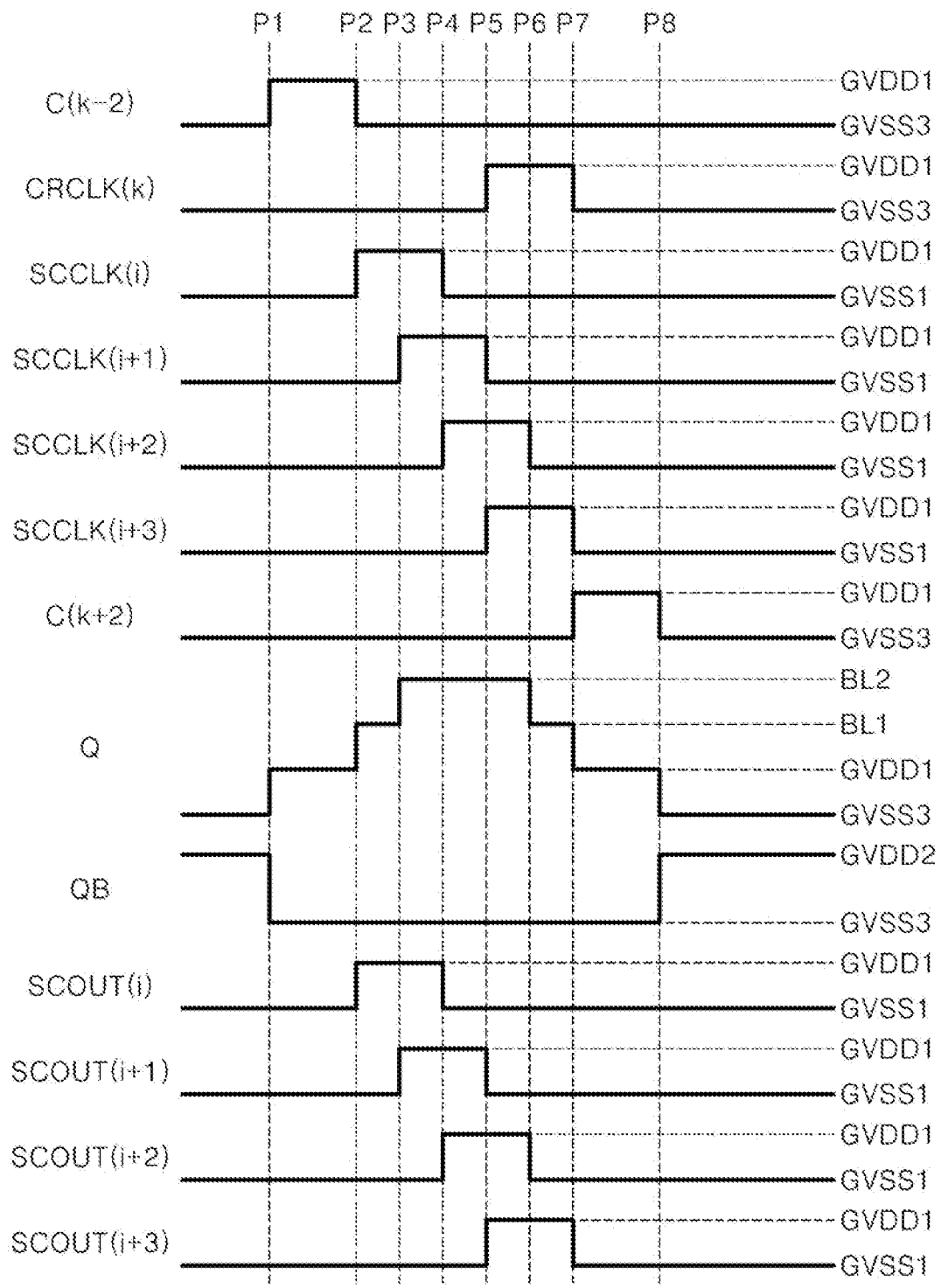
FIG. 8 shows waveforms of each of an input signal and an output signal when the stage circuit of FIG. 7 outputs a gate signal for image display according to an embodiment of the present disclosure.

FIG. 8 shows an waveform of each of an input signal and an output signal when the stage circuit of FIG. 7 outputs a gate signal for image display.

When a high level front carry signal C(k−2) is input for a period P1 to P2, the first transistor T21 and the second transistor T22 of the Q node controller 504 are turned on. Accordingly, the Q node has been charged to the first high-potential voltage GVDD1 level. Further, the first transistor T51 of the QB node stabilizer 510 is turned on based on a high level front carry signal C(k−2), and thus the QB node has been discharged to the third low-potential voltage GVSS3 level.

When a high level scan clock signal SCCLK(i) is input for a period P2 to P3, the boosting capacitor CS1 can bootstrap a voltage of the Q node to a first boosting voltage BL1 level higher than that of the first high-potential voltage GVDD1. Accordingly, the gate signal SCOUT(i) is output from second output node NO2 for a period P2 to P3.

When a high level scan clock signal SCCLK(i+1) together with a high level scan clock signal SCCLK(i) are input for a period P3 to P4, the boosting capacitors CS1 and CS2 bootstrap a voltage of the Q node to a second boosting voltage BL2 level which is higher than that of the first boosting voltage BL1. Accordingly, the gate signal SCOUT(i+1) is output from the third output node NO3 for a period P3 to P4.

When a high level scan clock signal SCCLK(i+2) together with a high level scan clock signal SCCLK(i+1) are input for a period P4 to P5, the boosting capacitors CS2 and CS3 bootstrap the voltage of the Q node to the second boosting voltage BL2 level which is higher than that of the first boosting voltage BL1. Accordingly, the gate signal SCOUT(i+2) is output from the fourth output node NO4 for a period P4 to P5.

When a high level scan clock signal SCCLK(i+3) together with a high level scan clock signal SCCLK(i+2) are input for a period P5 to P6, the boosting capacitors CS3 and CS4 bootstrap the voltage of the Q node to the second boosting voltage BL2 level which is higher than that of the first boosting voltage BL1. Accordingly, the gate signal SCOUT(i+3) is output from the fifth output node NO5 for a period P5 to P6.

For a P6 to P7, only a high level scan clock signal SCCLK(i+3) is input. The boosting capacitor CS4 bootstraps the voltage of the Q node to the first boosting voltage BL1 level.

Further, when a high level carry clock signal CRCLK(k) is input for a period P5 to P7, the first transistor T81 turned on based on the voltage charged to the Q node can allow the carry signal C(k) to be output from the first output node NO1.

Since the scan clock signal is not input for a period P7 to P8, the voltage of the Q node has again been charged to the first high-potential voltage GVDD1 level. Further, when the rear carry signal C(k+2) at a high level is input for the period P7 to P8, the third transistor T23 and the fourth transistor T24 of the Q node controller 504 are turned on. Accordingly, at a time-point P8, the Q node has been discharged to the third low-potential voltage GVSS3 level. When the Q node has been discharged to the third low-potential voltage GVSS3 level, the fourth transistor T44 included in the inverter 508 can be turned off, and the second high-potential voltage GVDD2 can be input to a gate of the first transistor T41 such that the first transistor T41 is turned on. When the first transistor T41 is turned on, the QB node has been charged to the second high-potential voltage GVDD2 level.

Figure 9:
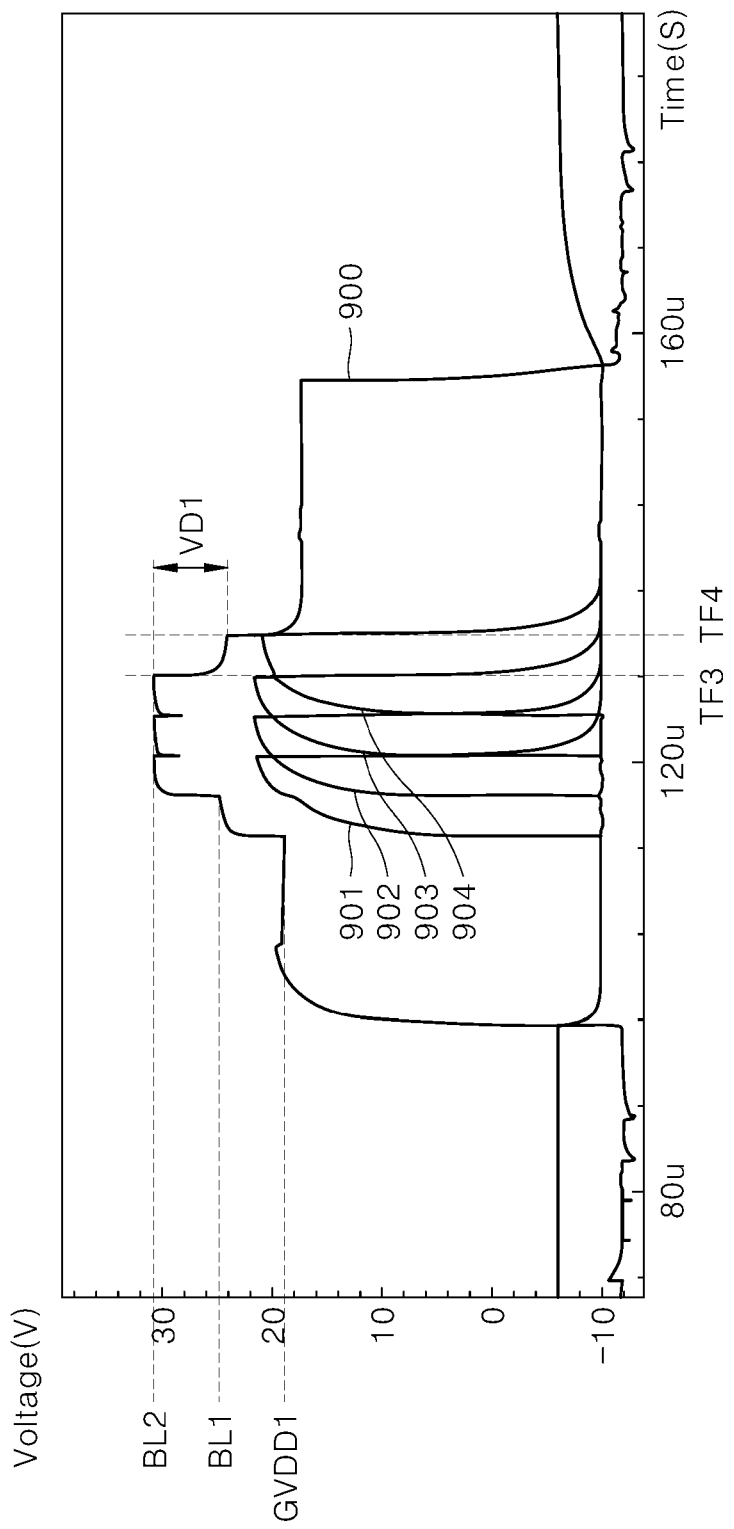
FIG. 9 shows a change in a voltage of a Q node when gate signals are output from the stage circuit of FIG. 7, and waveforms of the gate signals therefrom according to an embodiment of the present disclosure.

FIG. 9 shows a change in a voltage of the Q node when the gate signals are output from the stage circuit of FIG. 7, and waveforms of the gate signals therefrom.

FIG. 9 shows each of a voltage waveform 900 of the Q node, a voltage waveform 901 of the gate signal SCOUT(i), a voltage waveform 902 of the gate signal SCOUT(i+1), a voltage waveform 903 of the gate signal SCOUT(i+2), and a voltage waveform 904 of the gate signal SCOUT(i+3), among the waveforms of the signals shown in FIG. 8, As shown, when the gate signal SCOUT(i) is output, the voltage of the Q node is bootstrap to the first boosting voltage BL1 level. Further, for each of a period for which the gate signal SCOUT(i) and the gate signal SCOUT(i+1) overlap each other, a period for which the gate signal SCOUT(i+1) and the gate signal SCOUT(i+2) overlap each other, and a period for the gate signal SCOUT(i+2) and the gate signal SCOUT(i+3) overlap each other, the voltage of the Q node is bootstrap to the second boosting voltage BL2 level. For a period when only the gate signal SCOUT(i+3) is output, the voltage of the Q node is again lowered to the first boosting voltage BL1 level.

Accordingly, a difference VD1 between a voltage value of the Q node at a time-point TF3 when a voltage value of the gate signal SCOUT(i+2) is maximum and a voltage value of the Q node at a time-point TF4 when a voltage value of the gate signal SCOUT(i+3) is maximum occurs. Due to the difference VD1 between the voltage values of the Q node at the two time-points TF3 and TF4, a falling time of the gate signal SCOUT(i+3) becomes larger than the falling time of each of the other gate signals.

An example falling time of each of the gate signals SCOUT(i), SCOUT(i+1), SCOUT(i+2), and SCOUT(i+3) measured while actually operating the stage circuit shown in FIG. 7 is as follows.

SCOUT(i): 0.359 µs
SCOUT(i+1): 0.368 µs
SCOUT(i+2): 0.394 µs
SCOUT(i+3): 0.457 µs

As described above, the falling time of the gate signal SCOUT(i+3) is larger than that of each of the other gate signals SCOUT(i), SCOUT(i+1), and SCOUT(i+2). In this connection, a difference between a minimum value 0.359 µs and a maximum value 0.457 µs of the falling time is 0.098 µs. In other words, the falling times for the four gate signals get slower and slower.

When there is an output difference between j gate signals output from one stage circuit, for example, four gate signals therefrom, a difference between magnitudes of the data voltages respectively charged to the sub-pixels receiving the gate signals can occur. Thus, the image display quality of the display device can be degraded. In this connection, j is a positive integer (e.g., some pixels line can be changed too long in comparison to other nearby pixels line that can be charged too short, in comparison, thus causing discrepancies to the viewer).

Hereinafter, embodiments of another stage circuit for reducing an output difference between a plurality of the gate signals output from one stage circuit are described.

Figure 10:
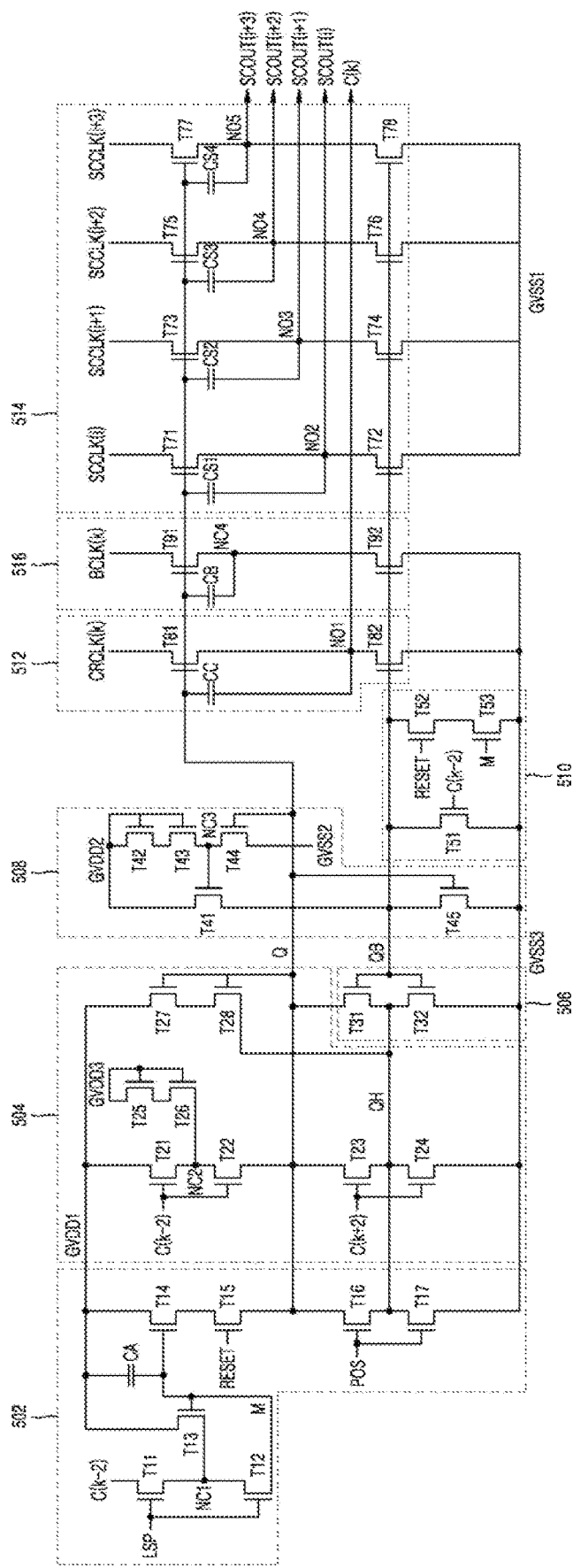
FIG. 10 is a circuit diagram of a stage circuit according to another embodiment of the present disclosure.

FIG. 10 is a circuit diagram of a stage circuit according to another embodiment of the present disclosure.

The stage circuit shown in FIG. 10 can be one stage circuit among the first to k-th stage circuits ST(1) to ST(k) shown in FIG. 4.

Referring to FIG. 10, the stage circuit according to another embodiment of the present disclosure includes an M node, a Q node, and a QB node.

Further, the stage circuit according to another embodiment of the present disclosure includes a line selector 502, a Q node controller 504, a Q node and QH node stabilizer 506, an inverter 508, a QB node stabilizer 510, a carry signal output module 512, and a gate signal output module 514.

A circuit configuration, a function and an operation method of each of the line selector 502, the Q node controller 504, the Q node and QH node stabilizer 506, the inverter 508, the QB node stabilizer 510, the carry signal output module 512, and the gate signal output module 514 shown in FIG. 10 can be same as a circuit configuration, a function and an operation method of each of the line selector 502, the Q node controller 504, the Q node and QH node stabilizer 506, the inverter 508, the QB node stabilizer 510, the carry signal output module 512, and the gate signal output module 514 shown in FIG. 7.

However, the stage circuit shown in FIG. 10 further includes a Q node bootstrapper 516 that bootstraps the voltage of the Q node when the gate signal is output.

The Q node bootstrapper 516 includes a first transistor T91, a second transistor T92, and a boosting capacitor CB.

The first transistor T91 is connected to and disposed between a clock signal line for delivering a boosting clock signal BCLK(k) and the fourth connection node NC4. The boosting capacitor CB is connected to and disposed between a gate and a source of the first transistor T91.

The first transistor T81 can be turned on when the voltage of the Q node is at a high level and thus can supply the boosting clock signal BCLK(k) at a high level voltage to the fourth connection node NC4.

In one embodiment of the present disclosure, while at least one of the scan clock signals SCCLK(i), SCCLK(i+1), SCCLK(i+2) and SCCLK(i+3) is maintained at a high level voltage level, the boosting clock signal BCLK(k) is maintained at a high level voltage level. In other words, the boosting clock signal BCLK(k) is maintained at a high voltage level for a duration from a time-point at which the scan clock signal SCCLK(i) at a high voltage level is supplied to a time-point at which the scan clock signal SCCLK(i+3) at a high voltage level is supplied.

While the boosting clock signal BCLK(k) is supplied to the fourth connection node NC4, the boosting capacitor CB bootstraps the voltage of the Q node in a synchronization manner with boosting clock signal BCLK(k) at the high level voltage level. Accordingly, the voltage of the Q node is bootstrapped to a third boost voltage BL3 or a fourth boost voltage BL4 level which is greater than that of the first boost voltage BL1 or the second boost voltage BL2.

The second transistor T92 can be turned on when the voltage of the QB node is at the high voltage level and thus can supply the third low-potential voltage GVSS3 to the fourth connection node NC4.

Figure 11:
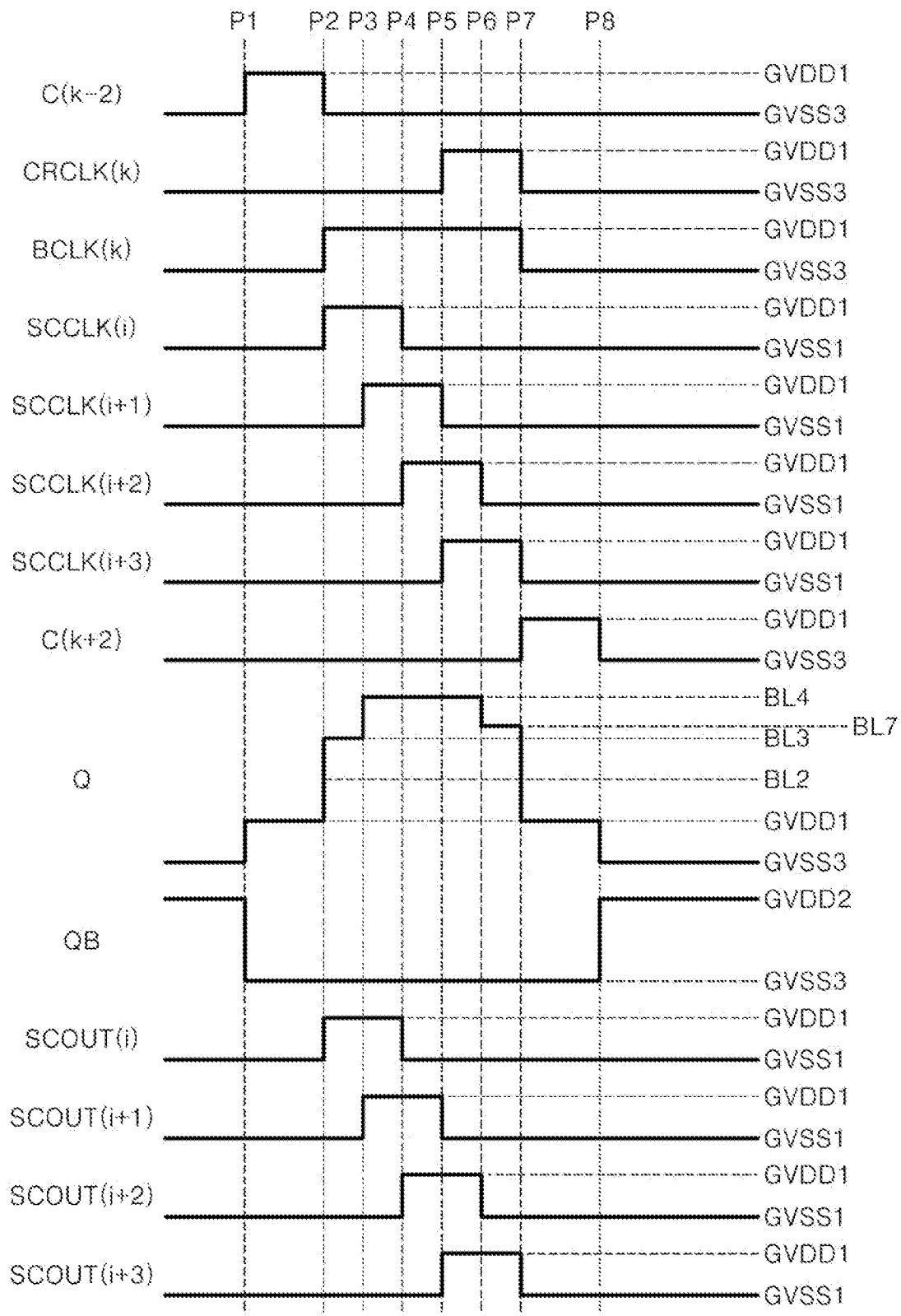
FIG. 11 shows waveforms of each of an input signal and an output signal when the stage circuit of FIG. 10 outputs a gate signal for image display according to an embodiment of the present disclosure.

FIG. 11 shows a waveform of each of an input signal and an output signal when the stage circuit of FIG. 10 outputs gate signals for image display.

Waveforms of a front carry signal C(k−2), a carry clock signal C(k), scan clock signals SCCLK(i), SCCLK(i+1), SCCLK(i+2), and SCCLK(i+3), a rear carry signal C(k+2), a QB node voltage, and gate signals SCOUT(i), SCOUT(i+1), SCOUT(i+2), and SCOUT(i+3) among waveforms of signals shown in FIG. 11 are the same as the waveforms of the signals shown in FIG. 8.

However, a signal waveform of the boosting clock signal BCLK(k) is added to FIG. 11. A voltage of the Q node in FIG. 11 differs from a voltage of the Q node shown in FIG. 8 due to an input of the boosting clock signal BCLK k.

Referring to FIG. 11, the boosting clock signal BCLK(k) is maintained at a high voltage level for a period P2 to P7. For the period P2 to P7, each of the scan clock signals SCCLK(i), SCCLK(i+1). SCCLK(i+2) and SCCLK(i+3) is maintained at a high level. Therefore, while the boosting clock signal BCLK(k) is maintained at a high level voltage level, the voltage of the Q node is bootstrapped to the third boost voltage BL3 or the fourth boost voltage BL4 level which is greater than that of the first boost voltage BL1 or the second boost voltage BL2.

For example, for the period P2 to P3 of FIG. 8, the boosting capacitor CS1 bootstraps and thus increases the voltage of the Q node to the first boost voltage BL1 level. However, for a period P2 to P3 of FIG. 11, the boosting capacitor CS1 and the boosting capacitor CB bootstrap the voltage of the Q node to the third boost voltage BL3 level that is even higher than that of each of the first boost voltage BL1 and the second boost voltage BL2.

Similarly, in for a period P3 to P6 of FIG. 11, the boosting capacitors CS2, CS3, and CS4 and the boosting capacitor CB bootstrap the voltage of the Q node to the fourth boost voltage BL4 level that is higher than the second boost voltage BL2 level.

Further, for a period P6 to P7 of FIG. 10, the boosting capacitor CS4 and the boosting capacitor CB bootstrap the voltage of the Q node to a voltage level (a seventh boost voltage BL7 level) between the third boost voltage BL3 level and the fourth boost voltage BL4 level (BL1<BL2<BL3<BL7<BL4).

Figure 12:
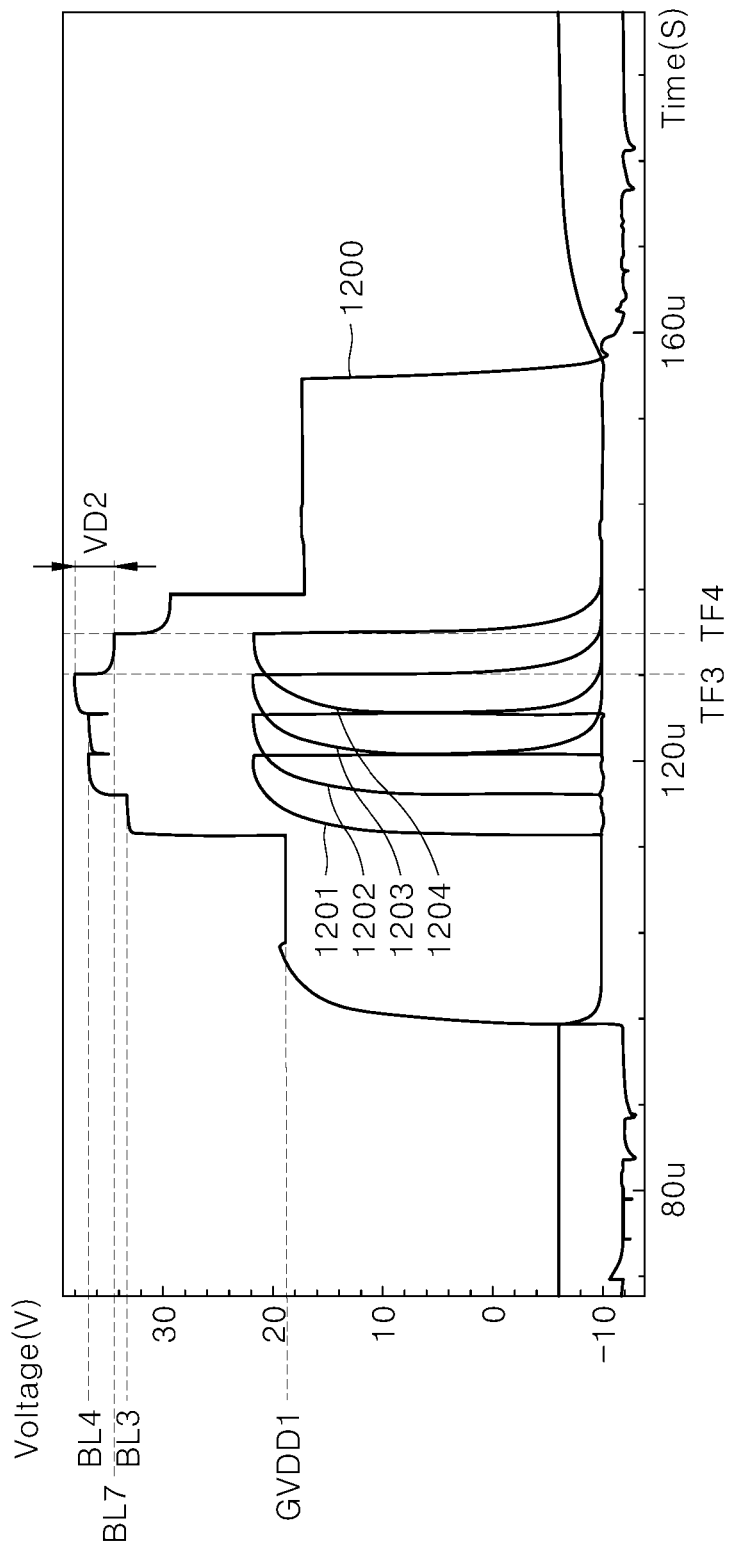
FIG. 12 shows a voltage change at a Q node when a gate signal is output from the stage circuit of FIG. 10, and waveforms of the gate signals therefrom according to an embodiment of the present disclosure.

FIG. 12 shows a change in a voltage of the Q node when the gate signals are output from the stage circuit of FIG. 10, and waveforms of the gate signals.

FIG. 12 shows each of a voltage waveform 1200 of the Q node, a voltage waveform 1201 of the gate signal SCOUT (i), a voltage waveform 1202 of the gate signal SCOUT(i+1), a voltage waveform 1203 of the gate signal SCOUT(i+2), and a voltage waveform 1204 of the gate signal SCOUT(i+3) among the waveforms of the signals shown in FIG. 11.

As shown, when the gate signal SCOUT(i) is output, the voltage of the Q node is bootstrapped to the third boosting voltage BL3 level higher than a level of the first boosting voltage BL1. Further, for each of a period for which the gate signal SCOUT(i) and the gate signal SCOUT(i+1) overlap each other, a period for which the gate signal SCOUT(i+1) and the gate signal SCOUT(i+2) overlap each other, and a period for which the gate signal SCOUT(i+2) and the gate signal SCOUT(i+3) overlap each other, the voltage of the Q node is bootstrap to the fourth boosting voltage BL4 level which is higher than that of the second boosting voltage BL2. For a period for which only the gate signal SCOUT (i+3) is output, the voltage of the Q node is maintained at a voltage level (i.e., the seventh boosting voltage BL7 level) between the levels of the third boosting voltage BL3 and the fourth boosting voltage BL4.

Accordingly, a difference VD2 between the voltage value of the Q node at a time-point TF3 where the voltage value of the gate signal SCOUT(i+2) is maximum and the voltage value of the Q node at a time-point TF4 where the voltage value of the gate signal SCOUT(i+3) is maximum occurs. The difference VD2 between the voltage values of the Q node at the two time-points TF3 and TF4 is smaller than the difference VD1 between the voltage values shown in FIG. 9. For this reason, the falling time of the gate signal SCOUT (i+3) output from the stage circuit shown in FIG. 10 is smaller than the falling time of the gate signal SCOUT(i+3) output from the stage circuit shown in FIG. 7.

An example falling time of each of the gate signals SCOUT(i), SCOUT(i+1), SCOUT(i+2), and SCOUT(i+3) measured while actually driving the stage circuit shown in FIG. 10 is as follows.

SCOUT(i): 0.337 μs
SCOUT(i+1): 0.336 μs
SCOUT(i+2): 0.345 μs
SCOUT(i+3): 0.364 μs

That is, the falling time 0.364 μs of the gate signal SCOUT(i+3) output from the stage circuit shown in FIG. 10 is smaller than or faster than the falling time 0.457 μs of the gate signal SCOUT(i+3) output from the stage circuit shown in FIG. 7. Thus, a difference between the minimum value 0.336 μs and the maximum value 0.364 μs of the falling time becomes 0.028 μs. This value 0.028 μs is smaller than the output difference value 0.098 μs between the gate signals from the stage circuit shown in FIG. 7.

Eventually, according to the embodiment of FIG. 10, the voltage of the Q node is additionally bootstrapped by the Q node bootstrapper 516. The additional bootstrapping of the voltage of the Q node can allow the Q node voltage to rise up when only a j-th gate signal (e.g., gate signal SCOUT (i+3) in the above example) among the j gate signals output from the stage circuit, that is, the first gate signal to j-th gate signals is output. Thus, a falling time of the j-th gate signal (e.g., gate signal SCOUT(i+3) in the above example) decreases. Accordingly, the output difference between the j gate signals output from the stage circuit is reduced, so that the image display quality of the display device is improved. In other words, the circuit in the embodiment of FIG. 10 can provide more boosting voltage levels that allow for a finer granularity of control, in order to make the falling times of the four output gate signals more similar and consistent.

Figure 13:
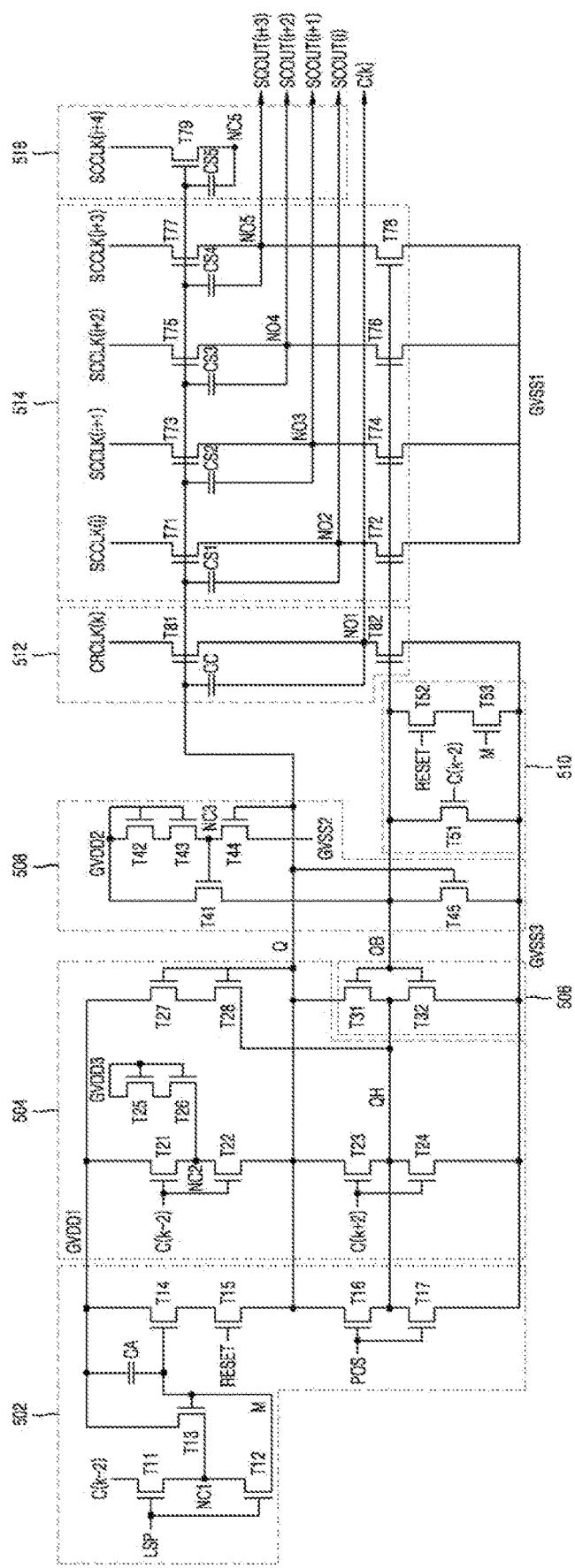
FIG. 13 is a circuit diagram of a stage circuit according to still another embodiment of the present disclosure.

FIG. 13 is a circuit diagram of a stage circuit according to still another embodiment of the present disclosure.

The stage circuit shown in FIG. 13 can be one stage circuit among the first to k-th stage circuits ST(1) to ST(k) shown in FIG. 4.

Referring to FIG. 13, the stage circuit according to still another embodiment of the present disclosure includes an M node, a Q node, and a QB node.

Further, the stage circuit according to still another embodiment of the present disclosure includes a line selector 502, a Q node controller 504, a Q node and QH node stabilizer 506, an inverter 508, a QB node stabilizer 510, a carry signal output module 512, and a gate signal output module 514.

A circuit configuration, a function and an operation method of each of the line selector 502, the Q node controller 504, the Q node and QH node stabilizer 506, the inverter 508, the QB node stabilizer 510, the carry signal output module 512, and the gate signal output module 514 shown in FIG. 13 can be same as a circuit configuration, a function and an operation method of each of the line selector 502, the Q node controller 504, the Q node and QH node stabilizer 506, the inverter 508, the QB node stabilizer 510, the carry signal output module 512, and the gate signal output module 514 shown in FIG. 7.

However, the stage circuit shown in FIG. 13 further includes a Q node bootstrapper 518 that bootstraps the voltage of the Q node when the gate signal is output.

The Q node bootstrapper 518 includes a ninth transistor T79 and a boosting capacitor C S5.

The ninth transistor T79 is connected to and disposed between a clock signal line for delivering a scan clock signal SCCLK(i+4) and a fifth connection node NC5. The boosting capacitor CS5 is connected to and disposed between a gate and a source of the ninth transistor T79.

The ninth transistor T79 can be turned on when the voltage of the Q node is at a high level and thus can supply the scan clock signal SCCLK(i+4) at a high level voltage to the fifth connection node NC5.

Figure 14:
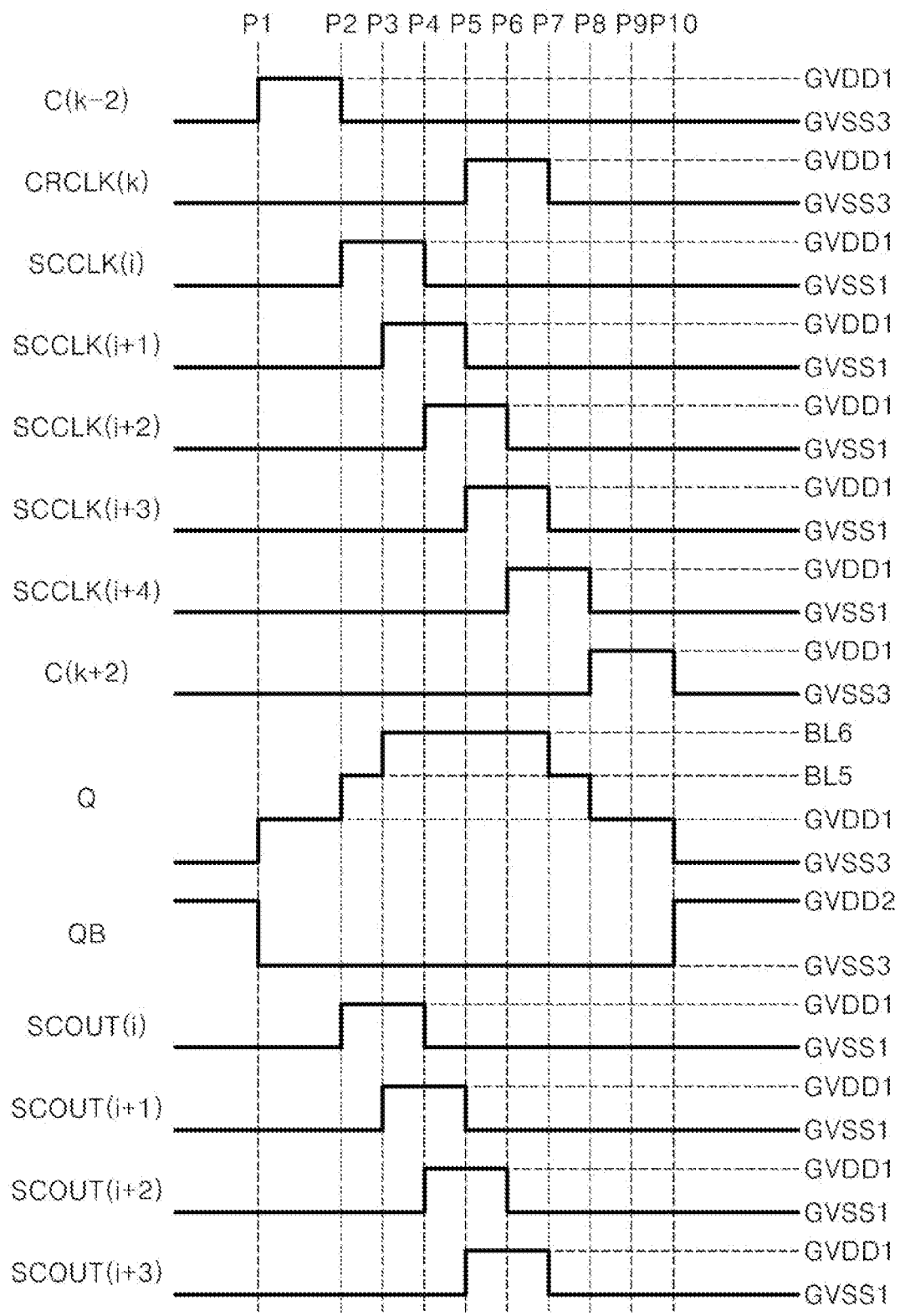
FIG. 14 shows waveforms of each of an input signal and an output signal when the stage circuit of FIG. 13 outputs a gate signal for image display according to an embodiment of the present disclosure.

In one embodiment of the present disclosure, an output timing of the scan clock signal SCCLK(i+4) partially overlaps with an output timing of the scan clock signal SCCLK(i+3) (e.g., see FIG. 14).

When the scan clock signal SCCLK(i+4) is supplied to the fifth connection node NC5, the boosting capacitor CS5 bootstraps the voltage of Q node in a synchronization manner with the scan clock signal SCCLK(i+4) at a high level voltage level. Accordingly, when the gate signal SCOUT(i+3) is output, the voltage of the Q node is maintained at the same voltage level as that of the voltage of the Q node when the gate signal SCOUT(i+2) is output.

That is, a (j+1)-th scan clock signal (e.g., the scan clock signal SCCLK(i+4)) together with the j scan clock signals corresponding to the j gate signals, for example, the first to j-th scan clock signals (e.g., the scan clock signals SCCLK(i) to SCCLK(i+3)) can be additionally input to the stage circuit in the embodiment of FIG. 13.

FIG. 14 shows a waveform of each of an input signal and an output signal when the stage circuit of FIG. 13 outputs gate signals for image display.

Waveforms of a front carry signal C(k−2), a carry clock signal C(k), scan clock signals SCCLK(i), SCCLK(i+1), SCCLK(i+2), and SCCLK(i+3), a rear carry signal C(k+2), a QB node voltage, and gate signals SCOUT(i), SCOUT(i+1), SCOUT(i+2), and SCOUT(i+3) among waveforms of signals shown in FIG. 14 are the same as the waveforms of the signals shown in FIG. 8.

However, a signal waveform of the scan clock signal SCCLK(i+4) is added to FIG. 14. Also, the voltage of the Q node in FIG. 14 differs from the voltage of the Q node shown in FIG. 8 due to an input of the scan clock signal SCCLK(i+4).

Referring to FIG. 14, when the scan clock signal SCCLK(i+4) at a high voltage level is input for a period P6 to P8, the scan clock signal SCCLK(i+4) overlaps with the scan clock signal SCCLK(i+3) for a period P6 to P7.

For the period P2 to P3 of FIG. 14, the boosting capacitor CS1 bootstraps the voltage of Q node to the fifth boost voltage BL5 level higher than that of the first high-potential voltage GVDD1.

Further, for a period P3 to P7 of FIG. 14, the boosting capacitors CS2, CS3, CS4, and CS5 bootstrap the voltage of the Q node to a sixth boost voltage BL6 level higher than a level of the fifth boost voltage BL5. For reference, magnitudes of the fifth boost voltage BL5 and the sixth boost voltage BL6 can be the same as or different from magnitudes of the first boost voltage BL1 and the second boost voltage BL1, respectively.

In particular, for a period P6 to P7, while the gate signal SCOUT(i+3) is output based on the scan clock signal SCCLK(i+3), the scan clock signal SCCLK(i+4) is input to the register circuit, so that the voltage of the Q node is maintained not at the fifth boost voltage BL5 level but at the sixth boost voltage BL6 level.

Further, for a period P7 to P8 of FIG. 14, the boosting capacitor CS1 bootstraps the voltage of the Q node to the fifth boost voltage BL5 level higher than that of the first high-potential voltage GVDD1.

Figure 15:
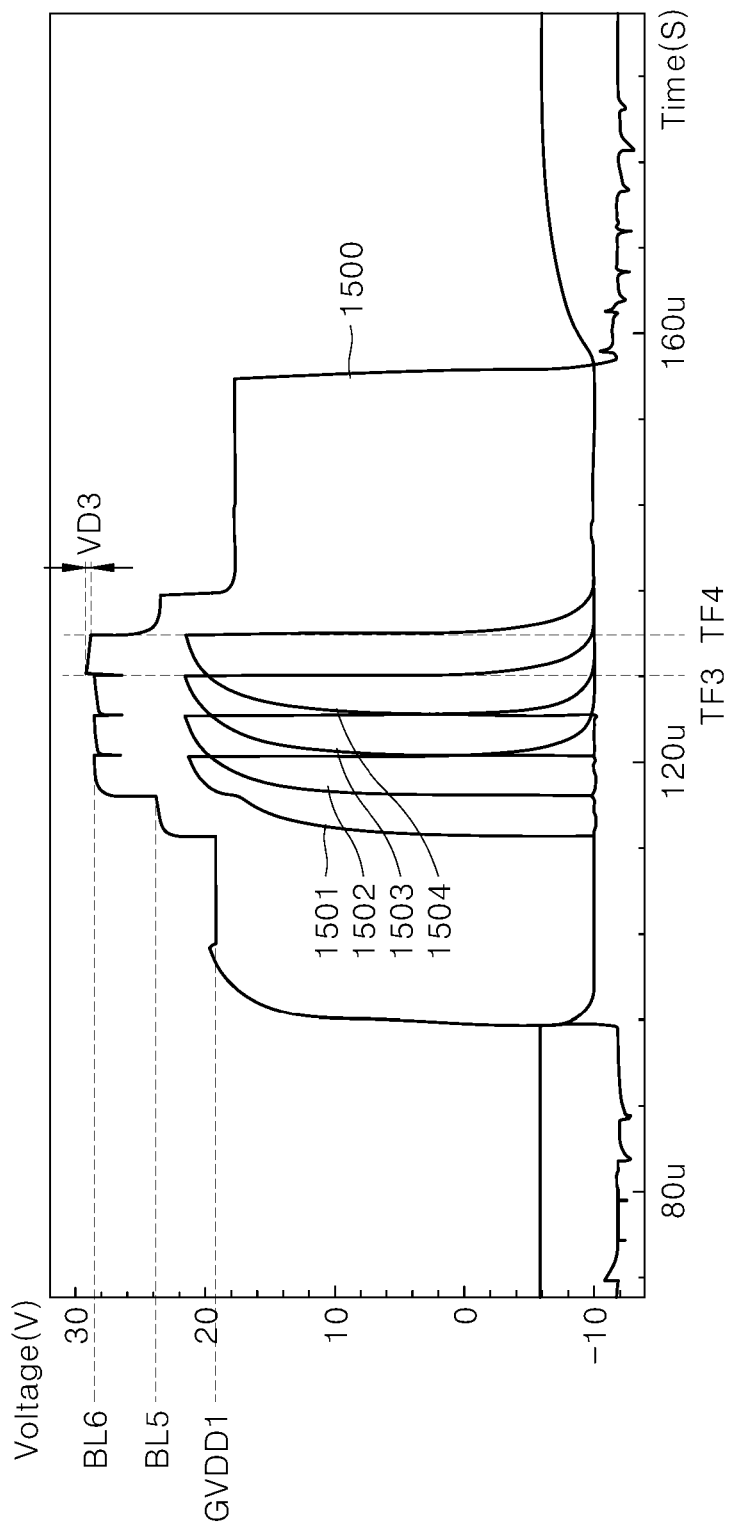
FIG. 15 shows a voltage change at a Q node when a gate signal is output from the stage circuit of FIG. 13, and waveforms of the gate signals therefrom according to an embodiment of the present disclosure.

FIG. 15 shows a change in a voltage of the Q node when the gate signals are output from the stage circuit of FIG. 13, and waveforms of the gate signals.

FIG. 15 shows each of a voltage waveform 1500 of the Q node, a voltage waveform 1501 of the gate signal SCOUT(i), a voltage waveform 1502 of the gate signal SCOUT(i+1), a voltage waveform 1503 of the gate signal SCOUT(i+2), and a voltage waveform 1504 of the gate signal SCOUT(i+3) among the waveforms of the signals shown in FIG. 12.

As shown, when the gate signal SCOUT(i) is output, the voltage of the Q node is bootstrapped to the fifth boosting voltage BL5 level. Further, for each of a period for which the gate signal SCOUT(i) and the gate signal SCOUT(i+1) overlap each other, a period for which the gate signal SCOUT(i+1) and the gate signal SCOUT(i+2) overlap each other, and a period for which the gate signal SCOUT(i+2) and the gate signal SCOUT(i+3) overlap each other, the voltage of the Q node is bootstrapped to the sixth boosting voltage BL6 level.

In one example, for a period for which only the gate signal SCOUT(i+3) is output, the voltage of the Q node is maintained at the sixth boosting voltage BL6 level. Accordingly, a difference VD3 between the voltage value of the Q node at a time-point TF3 when the voltage value of the gate signal SCOUT(i+2) is maximum and the voltage value of the Q node at a time-point TF4 when the voltage value of the gate signal SCOUT(i+3) is maximum occurs. The difference VD3 between the voltage values of the Q node at the two time-points TF3 and TF4 is smaller than the difference VD1 between the voltage values shown in FIG. 9. For this reason, the falling time of the gate signal SCOUT(i+3) output from the stage circuit shown in FIG. 13 is smaller than or faster than the falling time of the gate signal SCOUT(i+3) output from the stage circuit shown in FIG. 7.

An example falling time of each of the gate signals SCOUT(i), SCOUT(i+1), SCOUT(i+2), and SCOUT(i+3) measured while actually driving the stage circuit shown in FIG. 13 is as follows.

SCOUT(i): 0.374 μs
SCOUT(i+1): 0.374 μs
SCOUT(i+2): 0.371 μs
SCOUT(i+3): 0.401 μs

That is, the falling time 0.401 µs of the gate signal SCOUT(i+3) output from the stage circuit shown in FIG. 13 is smaller than or faster than the falling time 0.457 µs of the gate signal SCOUT(i+3) output from the stage circuit shown in FIG. 7. Thus, a difference between the minimum value 0.374 µs and the maximum value 0.401 µs of the falling time becomes 0.030 µs. This value 0.030 µs is smaller than the output difference value 0.098 µs between the gate signals from the stage circuit shown in FIG. 7.

Eventually, according to the embodiment of FIG. 13, the voltage of the Q node is additionally bootstrapped by the Q node bootstrapper 518 for a period when only the gate signal SCOUT(i+3) is output. The additional bootstrapping of the voltage of the Q node can allow the Q node voltage to rise up when only a j-th gate signal (e.g., gate signal SCOUT (i+3) in the above example) among the j gate signals output from the stage circuit, that is, the first gate signal to j-th gate signals is output. Thus, a falling time of the j-th gate signal (e.g., gate signal SCOUT(i+3) in the above example) decreases or is shortened. Accordingly, the output difference between the j gate signals output from the stage circuit is reduced, so that the image display quality of the display device is improved.

In one example, a stage circuit according to another embodiment of the present disclosure can include both the Q node bootstrapper 516 shown in FIG. 10 and the Q node bootstrapper 518 shown in FIG. 13. In other words, according to an embodiment, the stage circuit shown in FIG. 7 can be modified to further include the Q node bootstrapper 516 shown in FIG. 10 as well as the Q node bootstrapper 518 shown in FIG. 13, in order to provide even better gate signals which have more similar falling times and even less variation, in order to provide even better image quality.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A gate driver circuit for a display device, the gate driver circuit comprising:
a plurality of stage circuits, each stage circuit among the plurality of stage circuits being configured to supply a gate signal to one or more gate lines, and including an M node, a Q node, a QH node, and a QB node,
wherein each stage circuit among the plurality of stage circuits further includes:
a line selector configured to:
in response to receiving a line sensing preparation signal, charge the M node based on a front carry signal,
in response to receiving a reset signal, charge the Q node to a first high-potential voltage level, and
in response to receiving a panel on signal, discharge the Q node to a third low-potential voltage level;

a Q node controller configured to:
in response to receiving the front carry signal, charge the Q node to the first high-potential voltage level, and
in response to receiving an input of a rear carry signal, discharge the Q node to the third low-potential voltage level;
a Q node and QH node stabilizer configured to discharge each of the Q node and the QH node to the third low-potential voltage level when the QB node is charged to a second high-potential voltage level;
an inverter configured to change a voltage level of the QB node based on a voltage level of the Q node;
a QB node stabilizer configured to discharge the QB node to a fourth low-potential voltage level based on an input of the rear carry signal, an input of the reset signal, and a charged voltage of the M node;
a carry signal output circuit portion configured to output a carry signal based on a carry clock signal or the third low-potential voltage;
a gate signal output circuit portion configured to output first to j-th gate signals based on the voltage level of the Q node or the voltage level of the QB node, where j is a positive integer; and
a Q node bootstrapper configured to bootstrap a voltage of the Q node when one or more of the first to j-th gate signals are output by the gate signal output circuit portion.

2. The gate driver circuit of claim 1, wherein the Q node bootstrapper is connected between the carry signal output circuit portion and the gate signal output circuit portion, or
wherein the gate signal output circuit portion is connected between the carry signal output circuit portion and the Q node bootstrapper.

3. The gate driver circuit of claim 1, wherein the fourth low-potential voltage level is same as the third low-potential voltage level.

4. The gate driver circuit of claim 1, wherein the Q node bootstrapper is further configured to operate based on the voltage level of the Q node, in order to bootstrap the voltage of the Q node based on a boosting clock signal.

5. The gate driver circuit of claim 4, wherein the Q node bootstrapper includes:
a first transistor configured to be turned on based on the voltage level of the Q node to supply the boosting clock signal to a fourth connection node;
a second transistor configured to be turned on based on the voltage level of the QB node to supply the third low-potential voltage to the fourth connection node; and
a boosting capacitor configured to bootstrap the voltage of the Q node in synchronization with the boosting clock signal, when the boosting clock signal is supplied to the fourth connection node.

6. The gate driver circuit of claim 4, wherein a high level of the boosting clock signal is supplied to the Q node bootstrapper while high levels of the first to j-th scan clock signals are supplied to the gate signal output circuit portion.

7. The gate driver circuit of claim 1, wherein the Q node bootstrapper is further configured to operate based on the voltage level of the Q node, in order to bootstrap the Q node based on a (j+1)-th scan clock signal.

8. The gate driver circuit of claim 7, wherein the Q node bootstrapper includes:
a first transistor configured to be turned on based on the voltage level of the Q node, in order to supply the (j+1)-th scan clock signal to a fifth connection node; and
a boosting capacitor configured to bootstrap the voltage of the Q node in synchronization with the (j+1)-th scan clock signal, when the (j+1)-th scan clock signal is supplied to the fifth connection node.

9. The gate driver circuit of claim 7, wherein a high level period of the (j+1)-th scan clock signal partially overlaps a high level period of the j-th scan clock signal.

10. A display device comprising:
a display panel including sub-pixels respectively disposed at intersections between gate lines and data lines;
a gate driver circuit configured to supply a scan signal to each of the gate lines;
a data driver circuit configured to supply a data voltage to each of the data lines; and
a timing controller configured to control the gate driver circuit and the data driver circuit,
wherein the gate driver circuit includes a plurality of stage circuits,
wherein each stage circuit among the plurality of stage circuits is configured to supply a gate signal to one or more gate lines among the plurality of gate lines, and includes an M node, a Q node, a QH node, and a QB node,
wherein each stage circuit among the plurality of stage circuits further includes:
a line selector configured to:
in response to an input of a line sensing preparation signal, charge the M node based on a front carry signal, or
in response to an input of a reset signal, charge the Q node to a first high-potential voltage level, or
in response to an input of a panel on signal, discharge the Q node to a third low-potential voltage level;
a Q node controller configured to:
in response to an input of the front carry signal, charge the Q node to the first high-potential voltage level, and
in response to an input of a rear carry signal, discharge the Q node to the third low-potential voltage level;
a Q node and QH node stabilizer configured to discharge each of the Q node and the QH node to the third low-potential voltage level when the QB node is charged to a second high-potential voltage level;
a carry signal output circuit portion configured to output a carry signal based on a carry clock signal or the third low-potential voltage;
a gate signal output circuit portion configured to output first to j-th gate signals based on the voltage level of the Q node or the voltage level of the QB node, where j is a positive integer; and
a Q node bootstrapper configured to bootstrap a voltage of the Q node when one or more of the first to j-th gate signals are output by the gate signal output circuit portion.

11. The display device of claim 10, wherein the Q node bootstrapper is further configured to operate based on the voltage level of the Q node, in order to bootstrap the voltage of the Q node based on a boosting clock signal.

12. The display device of claim 11, wherein the Q node bootstrapper includes:
a first transistor configured to be turned on based on the voltage level of the Q node to supply the boosting clock signal to a fourth connection node;
a second transistor configured to be turned on based on the voltage level of the QB node to supply the third low-potential voltage to the fourth connection node; and
a boosting capacitor configured to bootstrap the voltage of the Q node in synchronization with the boosting clock signal, when the boosting clock signal is supplied to the fourth connection node.

13. The display device of claim 11, wherein a high level of the boosting clock signal is supplied to the Q node bootstrapper while high levels of the first to j-th scan clock signals are supplied to the gate signal output circuit portion.

14. The display device of claim 10, wherein the Q node bootstrapper is further configured to operate based on the voltage level of the Q node, in order to bootstrap the Q node based on a (j+1)-th scan clock signal.

15. The display device of claim 14, wherein the Q node bootstrapper includes:
a first transistor configured to be turned on based on the voltage level of the Q node, in order to supply the (j+1)-th scan clock signal to a fifth connection node; and
a boosting capacitor configured to bootstrap the voltage of the Q node in synchronization with the (j+1)-th scan clock signal, when the (j+1)-th scan clock signal is supplied to the fifth connection node.

16. The display device of claim 14, wherein a high level period of the (j+1)-th scan clock signal partially overlaps a high level period of the j-th scan clock signal.

17. The display device of claim 10, wherein each stage circuit among the plurality of stage circuits further comprises:
an inverter configured to change a voltage level of the QB node based on a voltage level of the Q node.

18. The display device of claim 10, wherein each stage circuit among the plurality of stage circuits further comprises:
a QB node stabilizer configured to discharge the QB node to a fourth low-potential voltage level based on an input of the rear carry signal, an input of the reset signal, and a charged voltage of the M node.

19. The display device of claim 10, wherein the Q node bootstrapper is connected between the carry signal output circuit portion and the gate signal output circuit portion, or
wherein the gate signal output circuit portion is connected between the carry signal output circuit portion and the Q node bootstrapper.

20. A gate driver circuit comprising:
at least one stage circuit configured to output first to j-th gate signals, where j is a positive integer,
wherein each of the at least one stage circuit includes a first node, a second node, and a third node,
wherein each of the at least one stage circuit further includes:
a line selector configured to:
in response to an input of a line sensing preparation signal, charge the first node based on a front carry signal, or
in response to an input of a reset signal, charge the second node to a first high-potential voltage level, or in response to an input of a panel on signal, discharge the second node to a third low-potential voltage level;
a second node controller configured to:
in response to an input of the front carry signal, charge the second node to the first high-potential voltage level, or
in response to an input of a rear carry signal, discharge the second node to the third low-potential voltage level;
a carry signal output circuit portion configured to output a carry signal;
a gate signal output circuit portion configured to output the first to j-th gate signals based on the voltage level of the second node or the voltage level of the third node, where j is a positive integer; and
a second node bootstrapper configured to bootstrap a voltage of the second node when one or more of the first to j-th gate signals are output by the gate signal output circuit portion, and
wherein the second node bootstrapper is connected between the carry signal output circuit portion and the gate signal output circuit portion, or wherein the gate signal output circuit portion is connected between the carry signal output circuit portion and the second node bootstrapper.

* * * * *